(12) United States Patent
Lin et al.

(10) Patent No.: US 12,176,214 B2
(45) Date of Patent: Dec. 24, 2024

(54) SELECTIVE METAL REMOVAL FOR CONDUCTIVE INTERCONNECTS IN INTEGRATED CIRCUITRY

(71) Applicant: Intel Corporation, Santa Clara, CA (US)

(72) Inventors: Kevin Lin, Beaverton, OR (US); Rahim Kasim, Portland, OR (US); Manish Chandhok, Beaverton, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 444 days.

(21) Appl. No.: 17/510,219

(22) Filed: Oct. 25, 2021

(65) Prior Publication Data

US 2022/0051896 A1 Feb. 17, 2022

Related U.S. Application Data

(62) Division of application No. 16/334,324, filed as application No. PCT/US2016/054919 on Sep. 30, 2016, now Pat. No. 11,158,515.

(51) Int. Cl.
*H01L 21/768* (2006.01)
*H01L 21/302* (2006.01)
(Continued)

(52) U.S. Cl.
CPC ...... *H01L 21/302* (2013.01); *H01L 21/76834* (2013.01); *H01L 21/76883* (2013.01);
(Continued)

(58) Field of Classification Search
None
See application file for complete search history.

(56) References Cited

U.S. PATENT DOCUMENTS 5,741,741 A 4/1998 Tseng
9,337,103 B2 5/2016 Lin et al.
(Continued)

OTHER PUBLICATIONS

International Preliminary Report on Patentability from PCT/US2016/054919 notified Apr. 11, 2019, 6 pgs.
(Continued)

*Primary Examiner* — Benjamin P Sandvik
(74) *Attorney, Agent, or Firm* — Essential Patents Group, LLP

(57) ABSTRACT

Techniques for selectively removing a metal or conductive material during processing of a semiconductor die for high-voltage applications are provided. In some embodiments, the techniques treat a metallized semiconductor die to transfer a feature from a patterned photoresist layer deposited on the metallized semiconductor die. In addition, the patterned metallized semiconductor die can be subjected to an etch process to remove an amount of metal according to the feature in the pattern, resulting in a treated metallized semiconductor die that defines an opening adjacent to at least a pair of neighboring metal interconnects in the die. The treated metallized semiconductor die can be further treated to backfill the opening with a dielectric material, resulting in a metallized semiconductor die having a back-filled dielectric member. Such a metallized semiconductor die can be further processed according to a process of record until metallization, after which additional selective removal of another amount of metal can be implemented. Semiconductor dies having neighboring metal interconnects separated by backfilled dielectric regions also are provided.

20 Claims, 19 Drawing Sheets

(51) Int. Cl.
  *H01L 23/522* (2006.01)
  *H01L 23/528* (2006.01)
  *H01L 23/00* (2006.01)
(52) U.S. Cl.
  CPC ........ *H01L 23/522* (2013.01); *H01L 23/5222* (2013.01); *H01L 23/5286* (2013.01); *H01L 24/19* (2013.01)

(56) References Cited

U.S. PATENT DOCUMENTS

| | | |
|---|---|---|
| 2008/0318435 A1 | 12/2008 | Mistkawi et al. |
| 2011/0100693 A1* | 5/2011 | Kwon ............... H01L 21/76807 174/250 |
| 2013/0161798 A1 | 6/2013 | Tomizawa |
| 2015/0056800 A1 | 2/2015 | Mebarki et al. |
| 2015/0091172 A1 | 4/2015 | Ko et al. |
| 2015/0091174 A1* | 4/2015 | Clarke .............. H01L 21/76879 257/770 |
| 2015/0243599 A1* | 8/2015 | Jezewski ........... H01L 23/53295 438/618 |
| 2015/0270224 A1* | 9/2015 | Boyanov ........... H01L 23/53209 257/751 |
| 2020/0105578 A1* | 4/2020 | Park .................. H01L 21/76816 |

OTHER PUBLICATIONS

International Search Report and Written Opinion from PCT/US2016/054919 notified Jun. 23, 2017, 9 pgs.
Non-Final Office Action from U.S. Appl. No. 16/334,324 notified Dec. 8, 2020, 10 pgs.
Notice of Allowance from U.S. Appl. No. 16/334,324 notified Jul. 9, 2021, 9 pgs.
Restriction Requirement from U.S. Appl. No. 16/334,324 notified Jul. 7, 2020, 10 pgs.

* cited by examiner

SELECTIVE METAL REMOVAL FOR CONDUCTIVE INTERCONNECTS IN INTEGRATED CIRCUITRY

CLAIM OF PRIORITY

This application is a Divisional of, and claims the benefit of priority to, U.S. patent application Ser. No. 16/334,324, filed on Mar. 18, 2019 and titled "SELECTIVE METAL REMOVAL FOR CONDUCTIVE INTERCONNECTS IN INTEGRATED CIRCUITRY," which is a National Stage Entry of, and claims the benefit of priority to, PCT Application No. PCT/US2016/054919, filed on Sep. 30, 2016 and titled "SELECTIVE METAL REMOVAL FOR CONDUCTIVE INTERCONNECTS IN INTEGRATED CIRCUITRY," which is incorporated by reference in entirety.

BACKGROUND

The continuing miniaturization of semiconductor devices and interconnects therein has resulted in complex processing to form interconnects. In high-voltage applications, for example, as semiconductor devices include smaller features, variable spacing between interconnects at high-voltage and interconnects configures as ground has become unavailable. As such, conductive float interconnects between high-voltage interconnects and ground interconnects can be introduced in the integrated circuitry in order to maintain a defined separation between a high-voltage interconnect and a ground interconnect. Yet, the fabrication of conductive float interconnects introduce complexities in the circuitry design due to the addition of undesired capacitance and the high-specificity required in the fabrication of the float interconnects. In addition, float interconnects consume real estate within the integrated circuitry and, in implementations including tight pitched interconnects, several other spurious electrostatic couplings can be introduced by the conductive float interconnects. Therefore, much remains to be improved in fabrication of interconnects in semiconductor dies.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

FIG. 4A illustrates a schematic cross-sectional view of an example solid metallized film in accordance with one or more embodiments of the disclosure;

FIG. 4B illustrates a schematic cross-sectional view of an example of a patterned photoresist mask covering the solid metallized film shown in FIG. 4A in accordance with one or more embodiments of the disclosure;

FIG. 4C illustrates a schematic cross-sectional view of an example of a treated solid metallized film resulting from treatment of the solid metallized film shown in FIG. 4B in accordance with one or more embodiments of the disclosure;

FIG. 4D illustrates a schematic cross-sectional view of an example of another treated solid metallized film resulting from further treatment of the solid metallized film shown in FIG. 4C in accordance with one or more embodiments of the disclosure;

FIG. 4E illustrates a schematic cross-sectional view of an example a dielectric layer covering the treated solid metallized film shown in FIG. 4D;

FIG. 4F illustrates a schematic cross-sectional view of an example of yet another solid metallized film having a metal interconnect line replaced with a dielectric material in accordance with one or more embodiments of the disclosure; and FIG. 4G illustrates a schematic cross-sectional view of an example of still another solid metallized film resulting from covering with a dielectric material the treated solid metallized film shown in FIG. 4F in accordance with one or more embodiments of the disclosure.

FIG. 6A illustrates a schematic cross-sectional view of an example treated solid metallized film in accordance with one or more embodiments of the disclosure;

FIG. 6B illustrates a schematic cross-sectional view of the treated solid metallized film shown in FIG. 6A after removal of metal in accordance with one or more embodiments of the disclosure; and FIG. 6C illustrates a schematic cross-sectional view of a resulting solid metallized film after subsequent treatments of the treated solid metallized film shown in FIG. 6B in accordance with one or more embodiments of the disclosure.

FIGS. 7A-7F illustrates the stages that permit or otherwise facilitate the removal of a first float contact, and FIGS. 7G-7L illustrate other stages that permit or otherwise facilitate the removal of a second float interconnect. Specifically, FIG. 7A illustrates a schematic cross-sectional view of an example solid metallized film in accordance with one or more embodiments of the disclosure;

FIG. 7B illustrates a schematic cross-sectional view of an example of a patterned photoresist mask covering the solid metallized film shown in FIG. 7A in accordance with one or more embodiments of the disclosure;

FIG. 7C illustrates a schematic cross-sectional view of an example of a treated solid metallized film resulting from treatment of the solid metallized film shown in FIG. 7B in accordance with one or more embodiments of the disclosure;

FIG. 7D illustrates a schematic cross-sectional view of an example of another treated solid metallized film resulting from further treatment of the solid metallized film shown in FIG. 7C in accordance with one or more embodiments of the disclosure;

FIG. 7E illustrates a schematic cross-sectional view of an example a dielectric layer covering the treated solid metallized film shown in FIG. 7D in accordance with one or more embodiments of the disclosure;

FIG. 7F illustrates a schematic cross-sectional view of an example of yet another solid metallized film having a conductive interconnect line replaced with a dielectric material in accordance with one or more embodiments of the disclosure; and FIG. 7G illustrates a schematic cross-sectional view of an example of a hard mask layer and a patterned photoresist mask layer covering the solid metallized film shown in FIG. 7F in accordance with one or more embodiments of the disclosure;

FIG. 7H illustrates a schematic cross-sectional view of an example of a treated solid metallized film resulting from further treatment of the solid metallized film shown in FIG. 7G in accordance with one or more embodiments of the disclosure;

FIG. 7I illustrates a schematic cross-sectional view of an example of another treated solid metallized film after the removal of metal from the solid metallized film shown in FIG. 7H in accordance with one or more embodiments of the disclosure;

FIG. 7J illustrates a schematic cross-sectional view of an example dielectric layer covering the treated solid metallized film shown in FIG. 7I in accordance with one or more embodiments of the disclosure;

FIG. 7K illustrates a schematic cross-sectional view of an example of still another solid metallized film resulting from subsequent treatment of the product substrate shown in FIG. 7K in accordance with one or more embodiments of the disclosure; and FIG. 7L illustrates a schematic cross-sectional view of an example of yet another solid metallized film having a second metal interconnect line replaced with a dielectric material in accordance with one or more embodiments of the disclosure.

FIG. 8A illustrates a schematic cross-sectional view of a solid metallized film in accordance with one or more embodiments of the disclosure;

FIG. 8B illustrates a schematic cross-sectional view of a treated solid metallized film resulting from the solid metallized film shown in FIG. 8A, after removal of metal in accordance with one or more embodiments of the disclosure; and FIG. 8C illustrates a schematic cross-sectional view of a resulting solid metallized film after subsequent treatments of the treated solid metallized film shown in FIG. 8B in accordance with one or more embodiments of the disclosure.

FIG. 9A illustrates a schematic cross-sectional view of a solid metallized film in accordance with one or more embodiments of the disclosure;

FIG. 9B illustrates a schematic cross-sectional view of a treated solid metallized film resulting from the solid metallized film shown in FIG. 9A, after removal of metal in accordance with one or more embodiments of the disclosure; and FIG. 9C illustrates a schematic cross-sectional view of a resulting solid metallized film after subsequent treatments of the treated solid metallized film shown in FIG. 9B in accordance with one or more embodiments of the disclosure.

FIG. 10A illustrates a schematic cross-sectional view of a solid metallized film in accordance with one or more embodiments of the disclosure;

FIG. 10B illustrates a schematic cross-sectional view of a treated solid metallized film resulting from the solid metallized film shown in FIG. 10A, after removal of metal in accordance with one or more embodiments of the disclosure; and FIG. 10C illustrates a schematic cross-sectional view of a resulting solid metallized film after subsequent treatments of the treated solid metallized film shown in FIG. 10B in accordance with one or more embodiments of the disclosure.

FIG. 11A illustrates a schematic cross-sectional view of a solid metallized film in accordance with one or more embodiments of the disclosure;

FIG. 11B illustrates a schematic cross-sectional view of a treated solid metallized film resulting from the solid metallized film shown in FIG. 11A, after removal of metal in accordance with one or more embodiments of the disclosure; and FIG. 11C illustrates a schematic cross-sectional view of a resulting solid metallized film after subsequent treatments of the treated solid metallized film shown in FIG. 11B in accordance with one or more embodiments of the disclosure.

FIG. 12A illustrates a schematic cross-sectional view of a solid metallized film in accordance with one or more embodiments of the disclosure;

FIG. 12B illustrates a schematic cross-sectional view of a treated solid metallized film resulting from the solid metallized film shown in FIG. 12A, after removal of metal in accordance with one or more embodiments of the disclosure; and FIG. 12C illustrates a schematic cross-sectional view of a resulting solid metallized film after subsequent treatments of the treated solid metallized film shown in FIG. 12B in accordance with one or more embodiments of the disclosure.

FIG. 13A illustrates a schematic cross-sectional view of a solid metallized film in accordance with one or more embodiments of the disclosure;

FIG. 13B illustrates a schematic cross-sectional view of a treated solid metallized film resulting from the solid metallized film shown in FIG. 13A, after removal of metal in accordance with one or more embodiments of the disclosure; and FIG. 13C illustrates a schematic cross-sectional view of a resulting solid metallized film after subsequent treatments of the treated solid metallized film shown in FIG. 13B in accordance with one or more embodiments of the disclosure.

DETAILED DESCRIPTION

Figure 1:
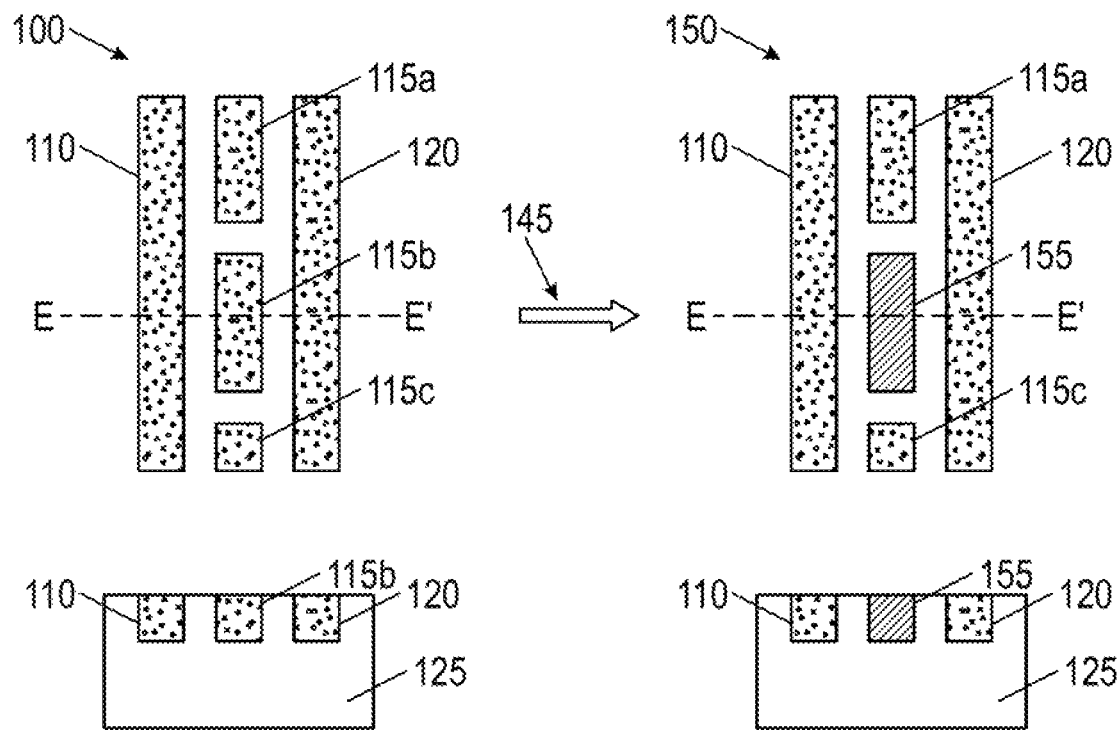
FIG. 1 illustrates top view and cross-sectional view of a schematic example of interconnects in accordance with one or more embodiments of the disclosure.

The disclosure recognizes and addresses, in at least some aspects, the issue of detrimental electrical coupling and/or mechanical coupling, such as capacitive cross-talk, electrical shorts, and the like, between closely-spaced metal interconnects within integrated circuitry. As spacing between metal interconnects is scaled down, such coupling(s) can be particularly damaging in high-voltage applications. Accordingly, the disclosure provides processes for mechanically and/or electrically decoupling conductive interconnects assembled in proximity to one another within integrated circuitry. In some aspects, the disclosure provides techniques for selectively removing a metal or conductive material during processing of a semiconductor die for high-voltage applications are provided. In some embodiments, the techniques treat a metallized semiconductor die to transfer a feature from a patterned photoresist layer deposited on the metallized semiconductor die. In addition, the patterned metallized semiconductor die can be subjected to an etch process to remove an amount of metal according to the feature in the pattern, resulting in a treated metallized semiconductor die that defines an opening adjacent to at least a pair of neighboring metal interconnects in the die. The treated metallized semiconductor die can be further treated to backfill the opening with a dielectric material, resulting in a metallized semiconductor die having a backfilled dielectric member. Such a metallized semiconductor die can be further processed according to a process of record until metallization, after which additional selective removal of another amount of metal can be implemented. Semiconductor dies having neighboring metal interconnects separated by backfilled dielectric regions also are provided. The various layers included in the solid films (e.g., solid metallized films, which may be included in a semiconductor die or wafer) included in the processing disclosed in this application can have essentially uniform thicknesses in a range from about 2 nm (e.g., two atomic monolayers) to about a 1 μm.

Embodiments of this disclosure can provide several advantages over conventional designs and fabrication of closely-spaced conductive interconnects in integrated circuitry. One example advantage includes simplification of layout and design. Specifically, floats of a specific length need not be specified and implemented in a semiconductor die. In addition, the removal of floats can yield reduce the size of high voltage areas, thus providing additional real estate in the semiconductor die by reducing the area consumption of high voltage interconnects. Another example advantage includes the reduction of undesired capacitance and/or undesired electrostatic effects such as charging and/or capacitive cross-talk. Yet another example advantage includes compatibility with existing process flows. Specifically, the processes in accordance with aspects of this disclosure can be integrated as an optional mask into existing processes, which avoids the need to re-design a process flow to permit or facilitate different metal densities, plug sizes, and the like. The process in accordance with aspects of this disclosure also can be integrated into any metalized layer by implementing an additional mask and a limited number of process steps.

With reference to the drawings, FIG. 1 illustrates top views and cross-sectional views of example interconnects that can be processed in accordance with one or more embodiments of the disclosure. Diagram 100 presents a top view of an initial set of interconnects include a power interconnect 110 and a power interconnect 120 and a set of float interconnects including float interconnect 115a, float interconnect 115b, and float interconnect 115c. An interlayer dielectric (ILD) structure or an intermetal dielectric (IMD) structure 125 separates the interconnects and the float interconnects. In one embodiment, the ILD structure or the IMD structure can include a low-k material. In other embodiments, the ILD structure of the IMD structure can include silicon oxyfluoride or silicon dioxide. In some embodiments, each of the power interconnect 110 and the power interconnect 120 is conductive and can be formed from or can include a metal or another type of conductive material. In addition, each of float interconnects 115a, 115b, and 115c can be made from or can include a metal or another type of conductive material. These metals can include one or more of aluminum, copper, nickel, tungsten, platinum, silver, gold, an alloy of two or more of the foregoing, a combination thereof, or the like.

In addition, diagram 200 illustrates a cross-sectional view of the power interconnect 110, power interconnect 120, and float interconnect 115 along the segment EE' shown in diagram 100. The distance between contact 110 and contact 120 can be predetermined and it can be based on a particular application of the integrated circuitry being formed as part of a chipset. The integrated circuitry can rely on power interconnect 110 and power interconnect 120 for operation.

A semiconductor die including a solid film having embedded therein the power interconnects 110 and 120, and the float interconnects 115a-115c can be processed in accordance with aspects described herein to remove at least a portion of the conductive material (e.g., a metal, an assembly or metals, an alloy, a doped semiconductor, or the like) that forms one or more of the float interconnects 115a-115c. Such processing is represented with an arrow in FIG. 1 and, in some embodiments, can selectively remove the conductive material that forms the float interconnect 115b, and can fill with a dielectric material the opening formed after the removal of the conductive material. Thus, after the initial set of interconnect is subjected to the processing in accordance with this disclosure, the float interconnect 115b can be replaced with a dielectric member 155. As illustrated, the dielectric member is adjacent to the power interconnect 110 and the power interconnect 120.

Figure 2:
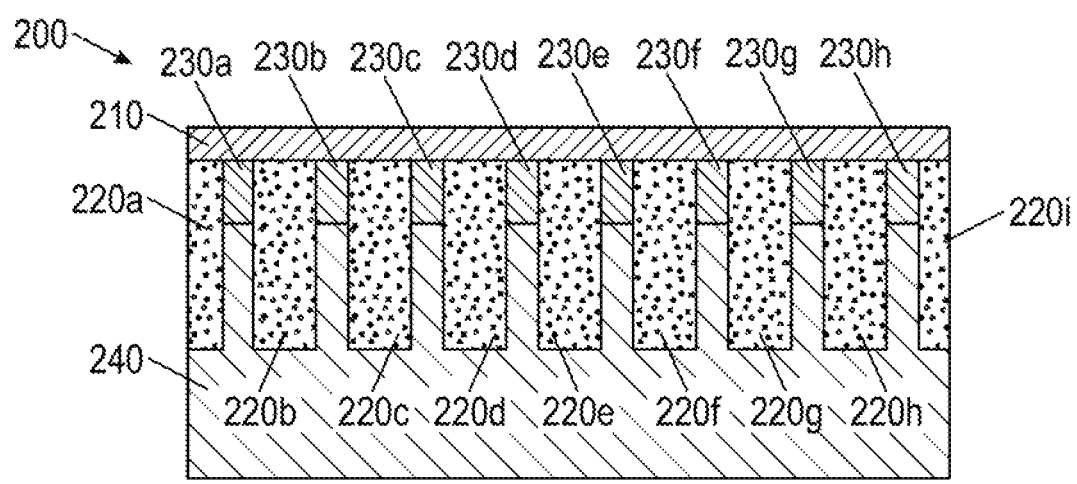
FIG. 2 illustrates a cross-sectional view of an example of a metallized film in accordance with one or more embodiments of the disclosure.

FIG. 2 illustrates a cross-sectional view of an example of a metallized film 200 in accordance with one or more embodiment of the disclosure. The metallized film 200 can constitute a semiconductor die that is being formed according to a defined process or record (POR). The metallized film 200 includes a dielectric structure 240 that can embody or can constitute an ILD structure or an IMD structure. The metallized film 200 also can have multiple conductive interconnects, including metal interconnect 220a, metal interconnect 220b, metal interconnect 220c, metal interconnect 220d, metal interconnect 220e, metal interconnect 220f, metal interconnect 220g, metal interconnect 220h, and metal interconnect 220i. Example of conductive materials that can form or constitute one or more of the conductive interconnects include metals (such as simple metals and noble metals) and alloys of titanium, tungsten, tantalum, aluminum, copper, ruthenium, cobalt, chromium, iron, palladium, molybdenum, manganese, vanadium, gold, silver, and niobium. Less conductive metal carbides, such as titanium carbide, zirconium carbide, tantalum carbide, tungsten carbide, and tungsten carbide, may also be used. Conductive interconnects, such interconnect lines, also can be formed from or can include a metal nitride, such as titanium nitride and tantalum nitride, or a conductive metal oxide, such as ruthenium oxide. Interconnect lines may also include alloys with rare earths, such as terbium and dysprosium. Conductive interconnect can embody or can constitute power interconnects (e.g., solder bumps, metal pillars, and the like) that can provide power to one or more components in a semiconductor die.

As illustrated, such metal interconnects can be intercalated, at least partially, with hard mask members, including hard mask member 230a, hard mask member 230b, hard mask member 230c, hard mask member 230d, hard mask member 230e, hard mask member 230f, hard mask member 230g, and hard mask member 230h. In addition, the metallized film 200 also includes an etch stop (ES) layer 210 or another type of barrier layer that can prevent or otherwise mitigate migration of metal ions from the one or more of the metal interconnects to another layer of dielectric material that may be formed on the upper surface of the metallized film 200. In some aspects, the etch stop material can permit continuing the patterning process that leads to the formation of a particular integrated circuitry that relies upon the metal interconnects present in a semiconductor die including the solid metallized film 200. As discussed before in certain embodiments, the patterning of the photoresist mask layer that determines the size and/or shape of the portion of the removed metal (or the amount of metal that is removed) can be controlled. In some embodiments, the ES layer 210 can include InP, SiGe compound, or TiN. In other embodiments, the ES layer 210 can include low-k materials, such as carbon doped silicon nitrides (a-SiNC:H) with k values of 4.5-5.8, dense oxygen doped silicon carbides (a-SiCO:H) with k values of 4.0-4.8; pure silicon carbides (a-SiC:H); a combination thereof; or the like. The ES layer 210 can be formed by one or a combination of numerous dielectric material deposition processes, including, for example, chemical vapor deposition (CVD); atomic layer deposition (ALD); physical vapor deposition (PVD); sputtering; chemical solution deposition; plating (e.g., electroless plating or electrolytic plating, immersion plating, or a combination thereof); spin coating; or the like. Chemical vapor deposition can include, for example, metal organic chemical vapor deposition (MOCVD), low-pressure chemical vapor deposition (LPCVD), or plasma enhanced chemical vapor deposition (PECVD). Other dielectric layers (e.g., hard mask layers, hard mask members, and the like) or amounts of dielectric material described herein also can formed by one or more of the foregoing deposition processes.

Figure 3A:
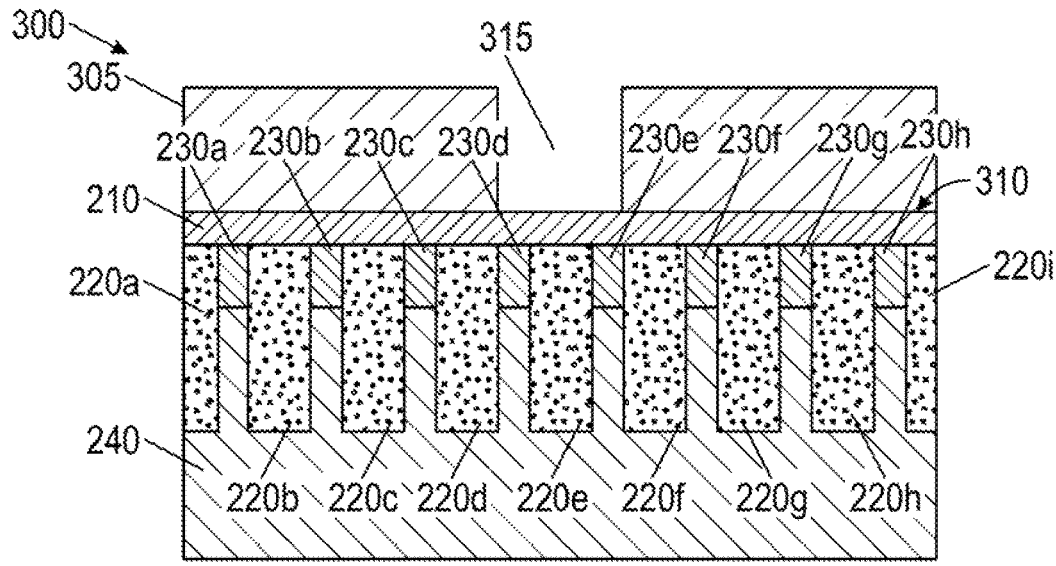
FIG. 3A illustrates a schematic cross-sectional view of a treated solid metallized film in accordance with one or more embodiments of the disclosure. Specifically, the treated solid metallized film can be obtained from treating the solid metallized film shown in FIG. 2.

As illustrated in FIG. 3A, the metallized film 200 can be treated to form a photoresist mask layer 305 on an upper surface 310 of the etch stop layer 210, resulting, resulting in a solid film. The photoresist mask layer 305 defines an opening 315 that exposes a portion of the upper surface 310 of the etch mask 210, and can permit or otherwise facilitate the removal of the metal interconnect 220e. In some implementations, treating the metallized film 200 can include depositing an amount of photoresist on an upper surface 310, and patterning the amount of photoresist to form the opening 315. The patterning can determine the position of the opening 315 on the upper surface 315 and, thus, the patterning can determine a section of the metallized film 200 that may be removed, including a metal interconnect within the metallized film 200.

Figure 3B:
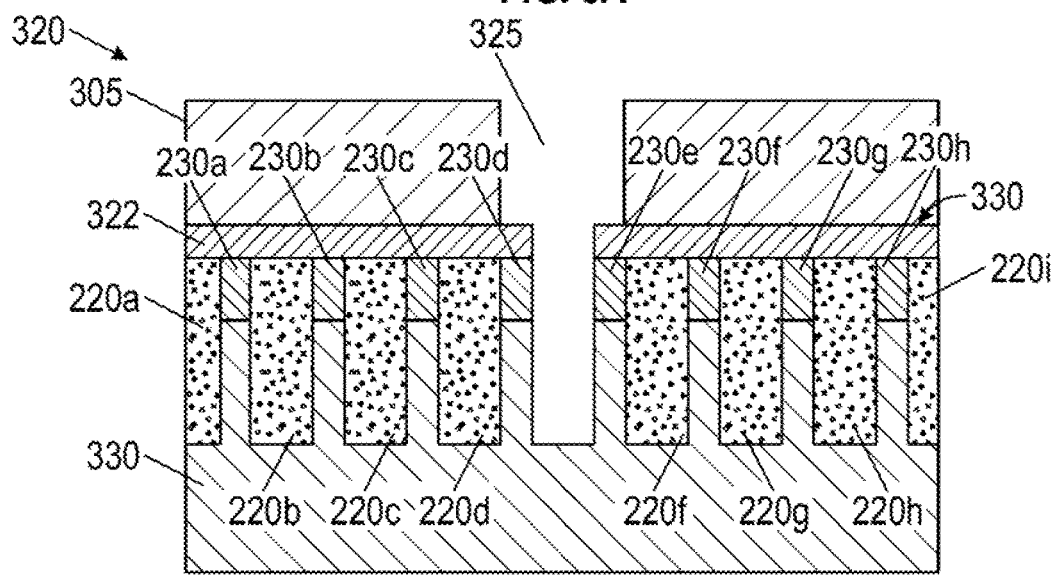
FIG. 3B illustrates a schematic cross-sectional view of another treated solid metallized film in accordance with one or more embodiments of the disclosure. The illustrated treated solid metallized film can be obtained from further treating the treated solid metallized film shown in FIG. 3A.

The solid film 300 can be treated to remove a section of the metallized film 200 underlying the photoresist mask layer 305, resulting in the solid film 320 shown in FIG. 3B. In one implementation, treating the solid film 300 can include etching a portion of the etch stop layer 210 to form a feature determined by the cross-section, in the x-y plane, of the opening 315 on the etch stop mask 210. As such, the etching can form an opening in the etch stop layer 210, the opening exposing a surface of the metal interconnect 220e. Etching the portion of the etch stop layer 210 yields a treated etch stop layer 322 and can include, in one example, subjecting the etch stop layer 210 to one of a dry etch process or a wet etch process. In some aspects, wet etching relies on a liquid solution for the removal of a material and generally is isotropic. Wet etching can utilize or otherwise rely upon aqueous hydroxide chemistries, including ammonium hydroxide and potassium hydroxide, solution of carboxylic acid/nitric acid/hydrofluoric acid, and solutions of citric acid/nitric acid/hydrofluoric acid. In other aspects, dry etching generally refers to etching that does not rely on a solution for the removal of a material, and generally is anisotropic. Dry etching can rely on a plasma (e.g., a gas of electrons) or ions. As such, dry etching includes plasma etching and reactive-ion etching (RIE) and its variants, such as deep REI.

In addition, treating the solid film 300 can include a subsequent etching of at least a portion of the metal interconnect 220e. The subsequent etching can include, in one example, subjecting the metal interconnect 220e to a wet etch process. In one aspect, the etching of the portion of the etch stop layer 210 and the subsequent etching of at least the portion of the metal interconnect 226e can yield an opening 328 in the solid film 320. Therefore, treating the solid film 300 in accordance with aspects of this disclosure can yield the solid film 320 that selectively lacks at least a portion of a metal interconnect present in a metallized film. As illustrated, the solid film 320 includes a treated dielectric structure 330 that defines, in part, the opening 325.

Figure 3C:
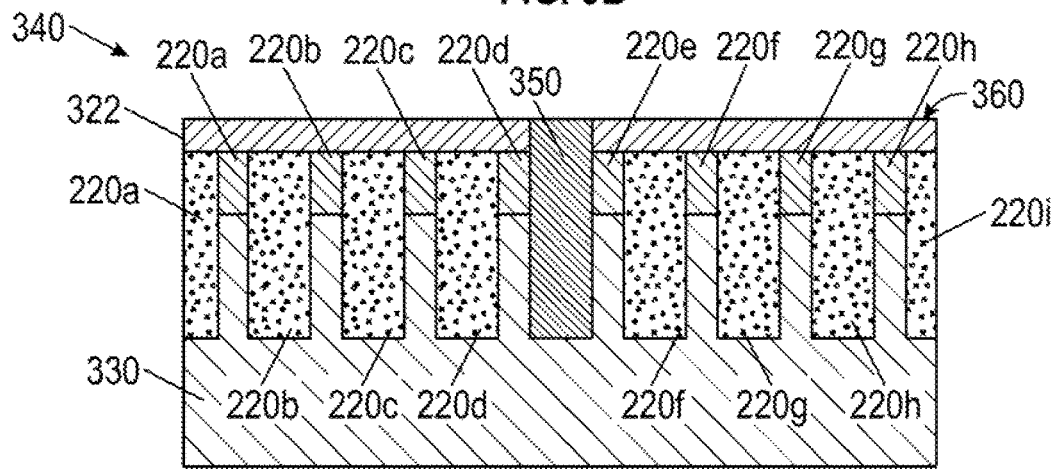
FIG. 3C illustrates a schematic cross-sectional view of yet another treated solid metallized film in accordance with one or more embodiments of the disclosure. The illustrated treated solid metallized film can be obtained from subsequent treatment of the treated solid metallized film shown in FIG. 3B.

The solid film 320 can be further treated to remove the photoresist mask layer 305 and to fill the remaining of the opening 325 with a dielectric material by depositing an amount of the dielectric material. The deposited amount of the dielectric material can cover the opening 325 and also can form an overburden layer (not depicted) on the treated etch stop layer 322. The overburden layer or any other excess dielectric material can be polished (chemically and/or mechanically) or otherwise removed to form a solid metallized film 340 as shown in FIG. 3C. It is noted that the overburden layer can simplify the polishing of the solid metallized film 340. The solid metallized film 340 can have a substantially flat surface 350 and includes a dielectric member 350 placed between adjacent metal interconnects, e.g., metal interconnect 220d and metal interconnect 220f, present in the metallized film 200 shown in FIG. 2.

In some embodiments, with reference to FIG. 1, after the backfill of the opening 325 with the dielectric material, the contact structure related to contact 110 and contact 120 can now include a set of dielectric backfill members that can replace at least one of the float interconnects 115a, 115b, and 115c. Therefore the float contacts present in a conventional interconnect arrangement, is no longer present and instead of having those float contacts in some embodiments we have a set of backfill dielectrics.

Figure 4A:
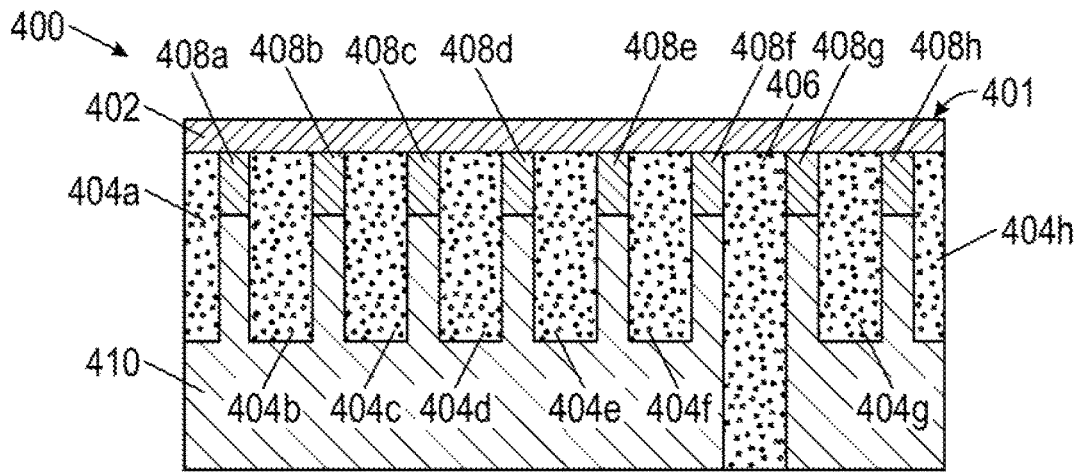
FIGS. 4A-4G illustrate schematic cross-sectional views representative of stages of an example process for selectively removing a float contact in accordance with one or more embodiments of the disclosure. Specifically.

FIG. 4A illustrates another example of a solid metallized film 400 that can permit selectively removing an amount of metal or another type of conductive material that embodies or constitutes a float interconnect. The solid metallized film 400 can constitute a semiconductor die that is being formed according to a defined POR. The solid metallized film 400 includes a dielectric structure 410 that can embody or can constitute an ILD structure or an IMD structure. The solid metallized film 400 also can have multiple conductive interconnects, including a metal interconnect 404a, a metal interconnect 404b, a metal interconnect 404c, a metal interconnect 404d, a metal interconnect 404e, a metal interconnect 404f, a metal interconnect 404g, and a metal interconnect 404h. The multiple conductive interconnects also can include a power interconnect 406 which can embody or can constitute, in some embodiments, a via configured at a high voltage (e.g., a few Volts) and included in a power distribution network (PDN). As illustrated, such metal interconnects can be intercalated, at least partially, with hard mask members, including hard mask member 408a, hard mask member 408b, hard mask member 408c, hard mask member 408d, hard mask member 408e, hard mask member 408f, hard mask member 408g, and hard mask member 408h. In addition, the solid metallized film 400 can include an etch stop layer 402 or another type of barrier layer that can prevent or otherwise mitigate migration of metal ions from the metal interconnects 408a-408h and/or metal interconnect 406 to another layer of dielectric material that may be formed on the upper surface of the solid metallized film 400.

Figure 4B:
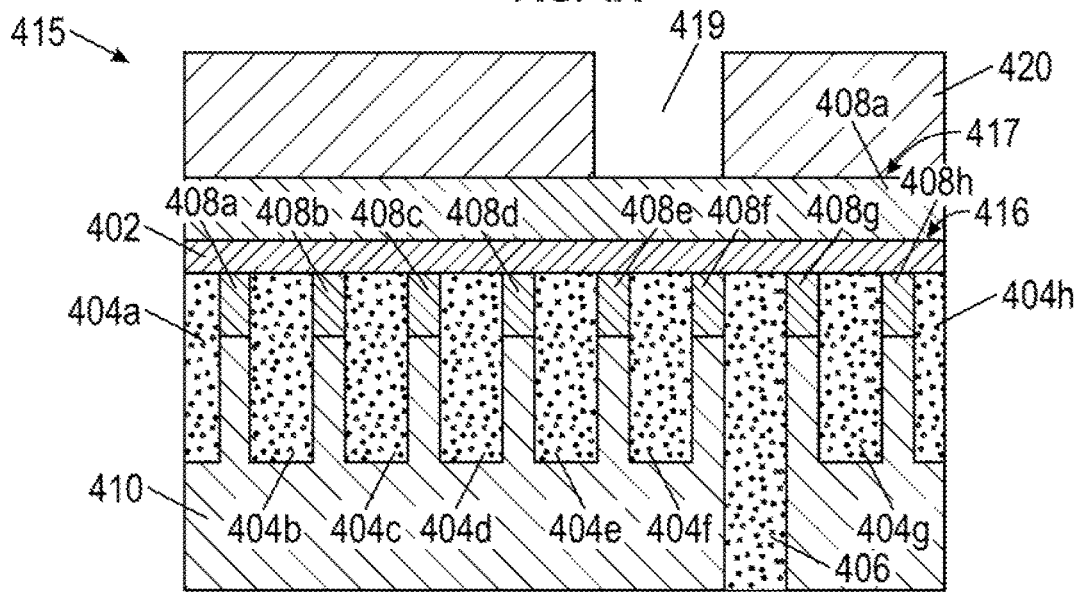

The solid metallized film 400 can be treated to form a hard mask (HM) layer 418 on an upper surface 416 of the ES layer 402. Subsequent to the formation of the HM layer 418, the resulting solid film (not depicted) can be treated to form a photoresist mask layer 420 on an upper surface 417 of the HM layer 418, resulting in a solid metallized film 415 as shown in FIG. 4B. The photoresist mask layer 420 can define an opening 419 that exposes a portion of the upper surface 417 of the HM mask 418. In some implementations, treating the metallized film 400 can include depositing an amount of photoresist on the upper surface 417, and patterning the amount of photoresist to form the opening 419. The patterning can determine the position of the opening 419 on the upper surface 417. Thus, in some aspects, the patterning can determine a section of the solid metallized film 400 that may be removed, including a metal interconnect within the solid metallized film 400. In the illustrated example, the opening 419 can permit or otherwise facilitate the removal of the metal interconnect 404f in accordance with aspects described herein.

Figure 4C:
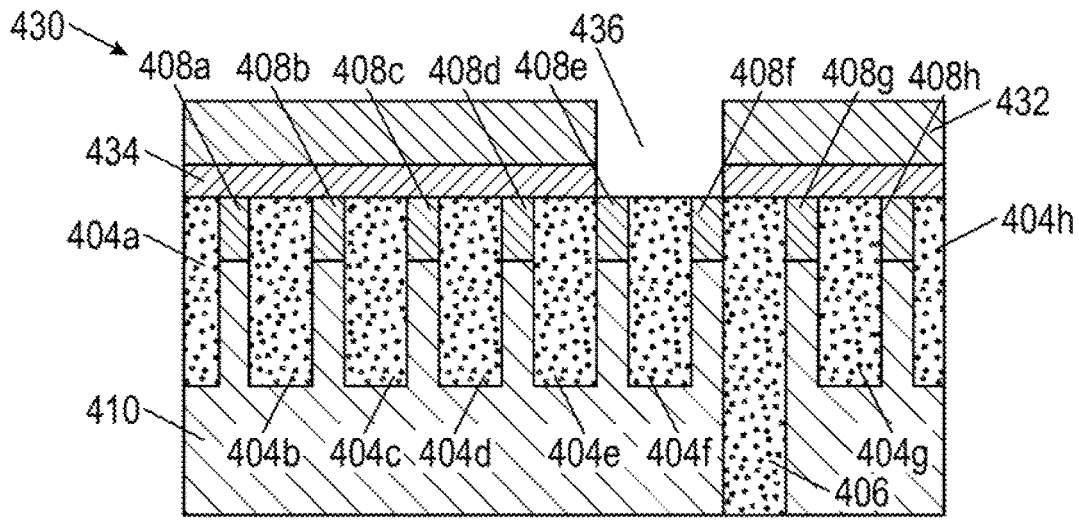

The solid metallized film 415 can be treated to remove a portion of the solid metallized film 400 underlying the HM layer 418 and the photoresist mask layer 420, resulting in the solid film 430 shown in FIG. 4C. In one implementation, treating the solid film 400 can include etching a portion of the HM layer 418 and etching a portion of the etch stop layer 210 to transfer a feature determined by the cross-section, in the x-y plane, of the opening 315 to the HM layer 418 and the etch stop mask 402. As such, in one example, the etching can yield a treated HM layer 432 and a treated ES layer 434, which layers can collectively define an opening 436 that exposes a surface of the metal interconnect 404f. Etching the portion of the HM layer 418 can include, in one implementation, subjecting the HM layer 418 to one of a first dry etch process or a first wet etch process. Similarly, etching the portion of the etch stop layer can include, in one implementation, subjecting the etch stop layer 402 to one of a second dry etch process or a second wet etch process. The dielectric material that forms or constitutes the HM layer 418 can be different from another dielectric material that forms or constitutes the ES layer 402, and therefore, the HM layer 418 and the ES layer 402 can provide respective types of etch selectivity. Accordingly, in one aspect, the first dry etch process and the second dry etch process can be specific to the HM layer 418 and the ES layer 402, respectively. Likewise, in another aspect, the first wet etch process and the second wet etch process can be specific to the HM layer 418 and the ES layer 402, respectively. The etch processes (e.g., the first dry etch process, the second dry etch process, the first wet etch process, and/or the second etch process) utilized or otherwise leveraged to treat the HM layer 418 and the ES layer 402 can be implemented for a time interval configured to permit the exposure of the upper surface of the metal interconnect 404f.

In addition, treating the solid film 300 can include a subsequent etching of at least a portion of the metal interconnect 404f. The subsequent etching can include, in one example, subjecting the metal interconnect 220e to a wet etch process, which process can provide greater selectivity than a dry etch process. In one aspect, the etching of the portion of the HM layer 418 and the portion of the etch stop layer 210 combined with the subsequent etching of at least the portion of the metal interconnect 226e can form an opening 436 in the metallized solid film 445. Therefore, treating the solid film 430 in accordance with aspects of this disclosure can result in a solid film 445 that selectively lacks at least a portion of a metal interconnect present in a metallized film.

Figure 4D:
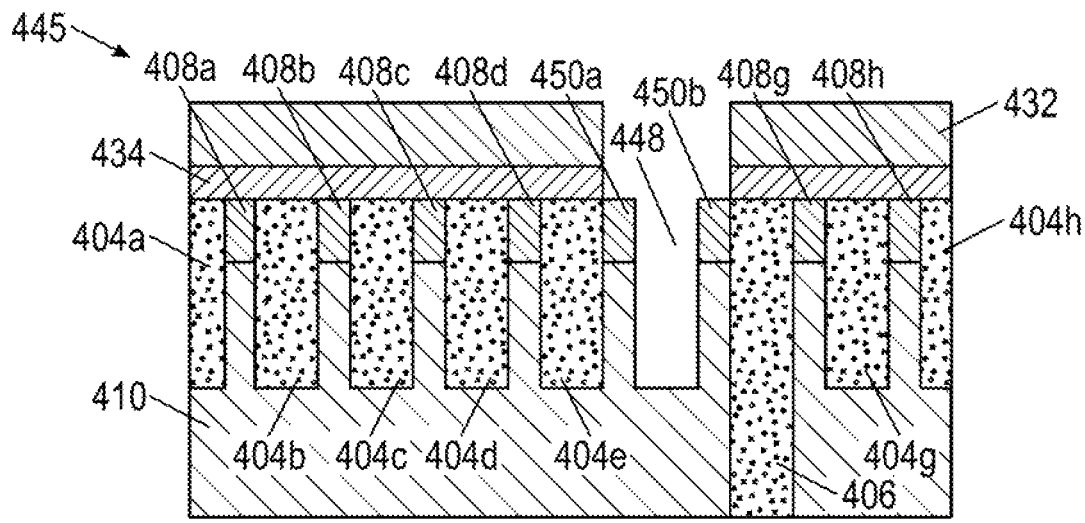

The opening 436 can be utilized or otherwise leveraged for further treatment of the solid metallized film 430 shown in FIG. 4C. In some implementations, an etch process can be utilized to treat the solid metallized film 430. More specifically, treating the solid metallized film 430 can include, in one example, subjecting the metal interconnect 404f to a wet etch process. In some aspects, the etching can yield a solid metallized film 445 that defines an opening 448, as is shown in FIG. 4D. The solid metallized film 445 includes a treated dielectric structure 452 that defines, in part, the opening 448. Therefore, similarly to other solid films of the disclosure, treating the solid metallized film 430 in accordance with aspects of this disclosure can yield the solid metallized film 445 that selectively lacks at least a portion of a metal interconnect present in the precursor metallized film 400 shown in FIG. 4A.

Figure 4E:
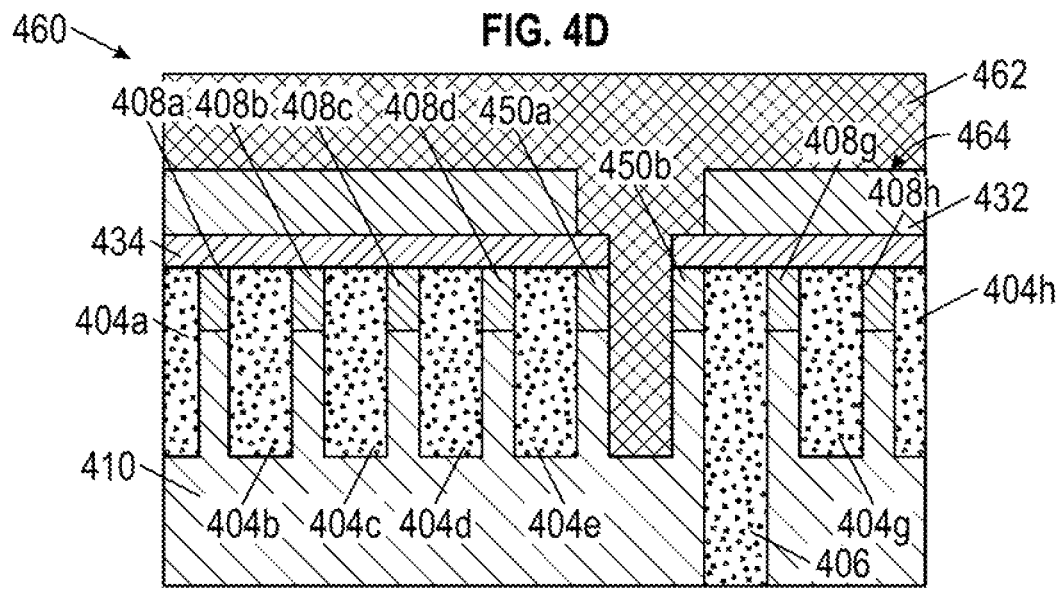

The solid metallized film 445 can be further treated to fill the opening 445 with a dielectric material by depositing an amount of the dielectric material. In one implementation, the amount of the dielectric material that is deposited can cover the opening 448 and can form an overburden layer on the treated HM layer 432. Therefore, the further treatment of the solid metallized layer 445 can yield a solid metallized film 460 having a dielectric structure 462, as is shown in FIG. 4E.

Figure 4F:
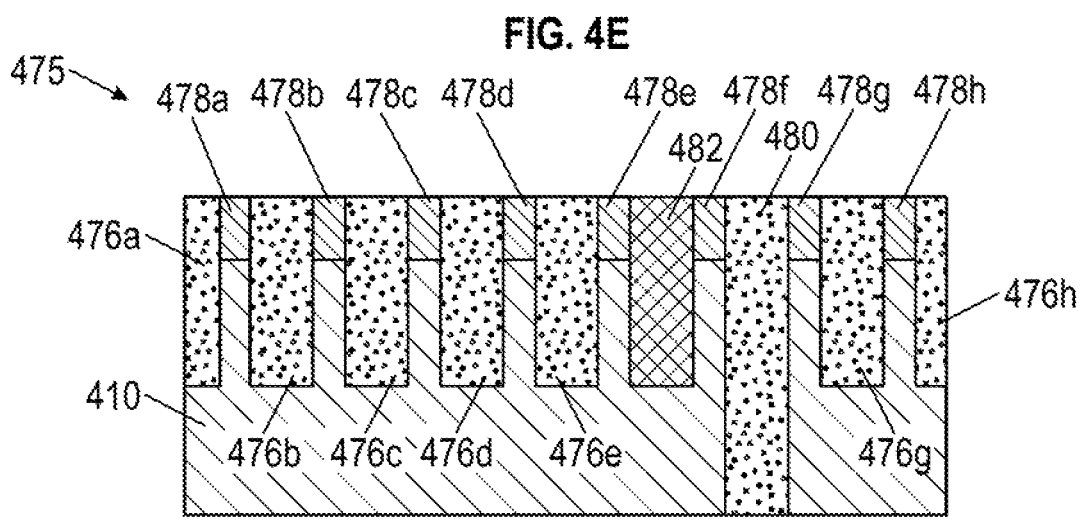

The overburden layer that constitutes the dielectric structure 462 and/or any other excess dielectric material that caps or otherwise coats the solid metallized film 445 can be polished (chemically and/or mechanically) or otherwise removed to form a solid metallized film 475, as shown in FIG. 4F. The solid metallized film 475 can be refined by polishing the surface onto which the photo resist layer 418 was disposed. Thus, the solid metallized film 475 can have a substantially flat surface and includes a dielectric member 482 placed between adjacent metal interconnects, e.g., metal interconnect 476e and metal interconnect 480.

Figure 4G:
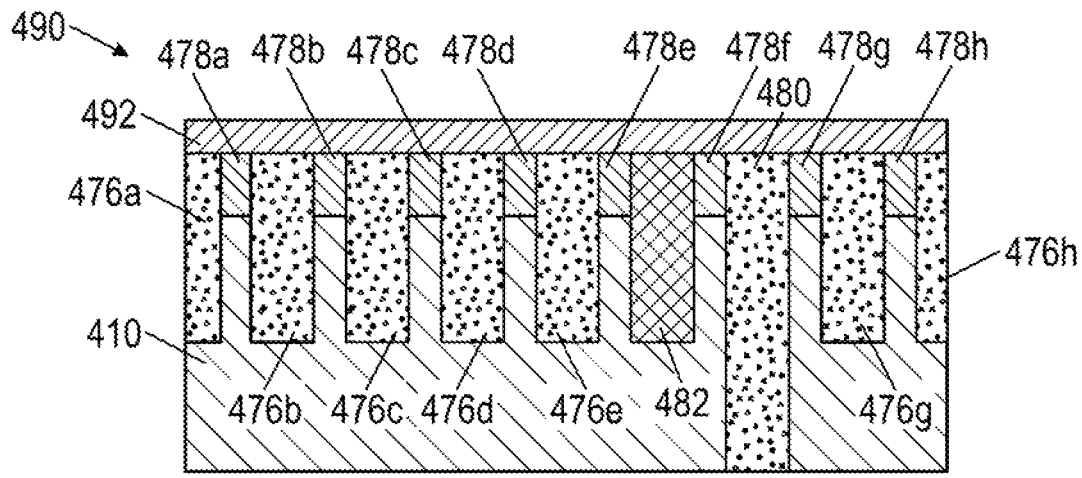

The solid metallized film 475 can be treated to form an ES layer 492 (or, in some embodiments, another type of barrier layer), resulting in a solid metallized film 490 as is shown in FIG. 4G. In one aspect, the ES layer 492 can abut or otherwise can be in contact with an upper surface of the ES layer 490. Similar to other ES layers of this disclosure, the ES layer 492 can prevent or otherwise mitigate migration of metal ions from the one or more of the metal interconnects 476a-476h and metal interconnect 480 to another layer of dielectric material that may be formed on the upper surface of the solid metallized film 490.

Figure 5A:
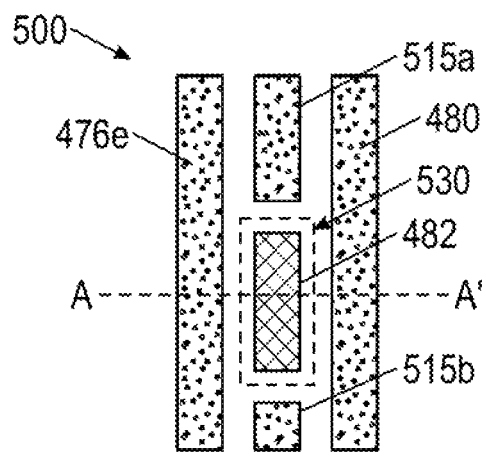
FIG. 5A illustrates a schematic top view of the solid metallized film shown in FIG. 4G, illustrating an arrangement of dielectric backfilled sections in accordance with one or more embodiments of the disclosure.
Figure 5B:
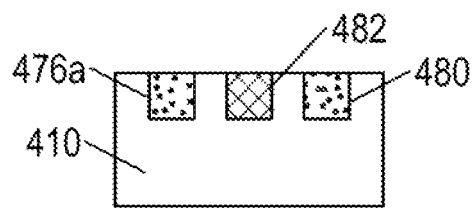
FIG. 5B illustrates a schematic side view of the solid metallized film shown in FIG. 4G, illustrating an arrangement of dielectric backfilled sections in accordance with one or more embodiments of the disclosure.

FIG. 5A and FIG. 5B present, respectively, a schematic top-view of a portion 500 of the solid metallized film shown in FIG. 4G and a cross-sectional view of the portion 500 along the AA' segment. Such a view illustrates an arrangement of dielectric backfilled parts of the solid metallized film 490 in accordance with one or more embodiments of the disclosure. As illustrated, the portion 500 can include backfilled dielectric member 482, dielectric member 515a, and dielectric member 515b. The portion 500 also includes the metal interconnect 476e and the power interconnect 480. As illustrated by the perimeter 530, an extended dielectric backfilled portion can cover the previously metallic section of the floats in the package.

In other embodiments, the patterning of a photoresist mask layer (e.g., PR mask layer 420) for removal of a float interconnect in accordance with aspects of this disclosure can be implemented according to numerous sizes and shapes of the openings in the photoresist mask layer. In some embodiments, a wet clean process can be utilized to remove a metal liner in order to achieve spatial resolution of the selective metal removal in accordance with this disclosure. In some scenarios in which the patterning of the photoresist mask layer includes small features (e.g., features with typical length of the order of 10 nm), the tolerance of a process for removing a float interconnect can increase.

Figure 6A:
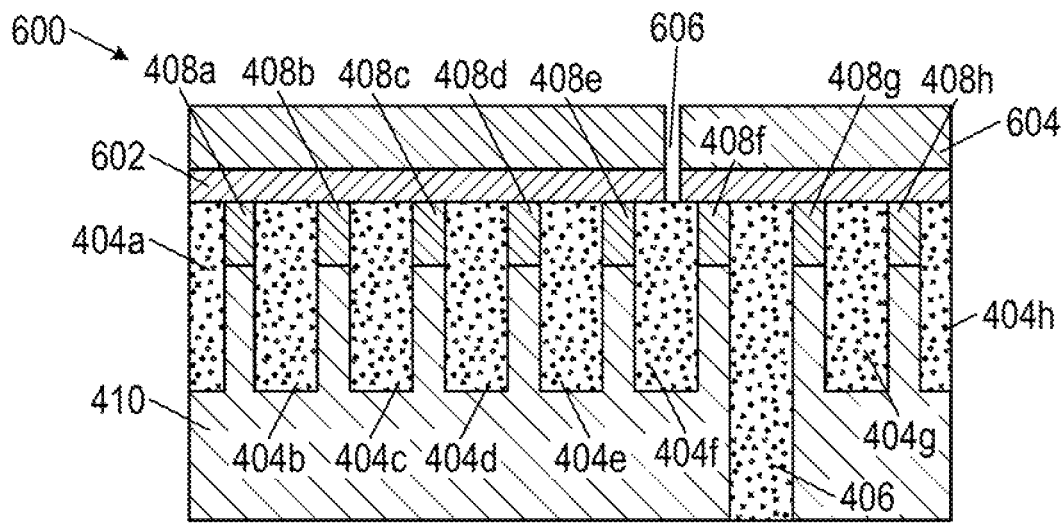
FIGS. 6A-6C illustrate schematic cross-sectional views representative of stages of another example process for selectively removing a float interconnect in accordance with one or more embodiments of the disclosure. Specifically.

As illustrated in FIG. 6A, the solid metallized film 400 can be treated to form a solid metallized film 600 including an ES layer 602 and a HM layer 604 that collectively define an opening 606. In some aspects, the opening 606 can be a tubular opening and exposes a portion of an upper surface of the metal interconnect 404f. A cross-sectional area, in the x-y plane, of the exposed upper surface can be smaller than the cross-sectional area that may be exposed by other openings (such as opening 436) described herein. As such, in one aspect, the opening 606 can permit or otherwise facilitate the selective removal of at least a portion of the underlying metal interconnect 404f with greater process tolerance that larger openings provide. To that end, in some implementations, the solid metallized film 600 can be treated, for example, via a wet etch process to remove at least the portion of the metal interconnect 404f. It is noted that after the etching or during the etching, the solid metallized film 600 can be cleaned to remove byproducts of the wet etch process. In some embodiments, dry etching can be utilized. More generally, any technique or process that permits the removal of an amount of a metal or conductive material from a solid structure can be utilized. Thus, without intending to be bound by modeling or interpretation, the greater process tolerance is generally due to a larger surface of a dielectric material that is inert to an etchant (e.g., an acid) utilized to remove an amount of metal in the metal interconnect 404f.

Figure 6B:
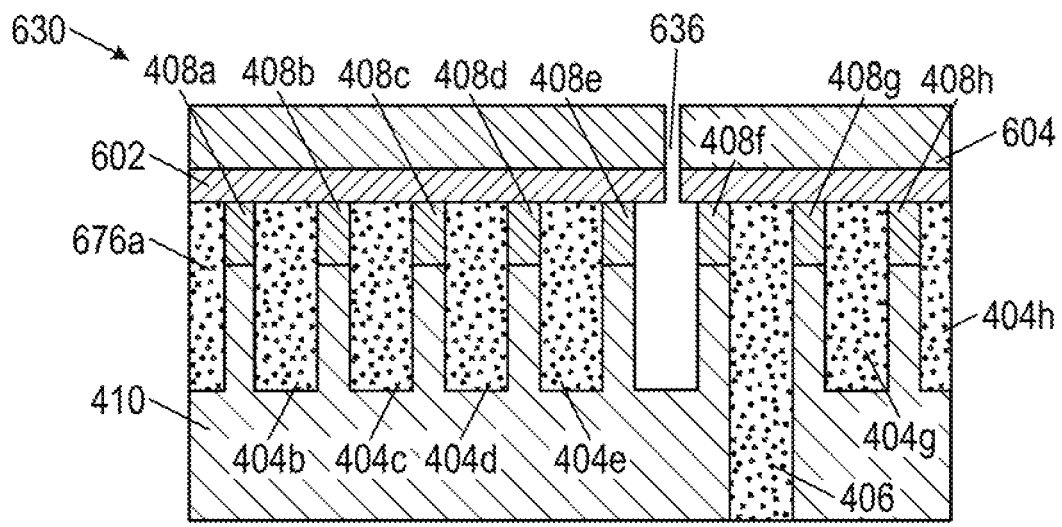
Figure 6C:
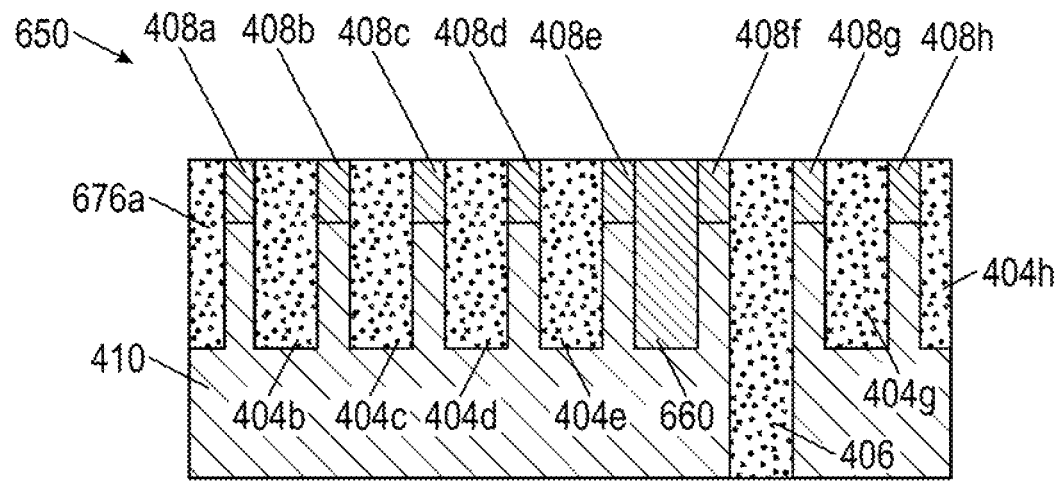
Figure 6D:
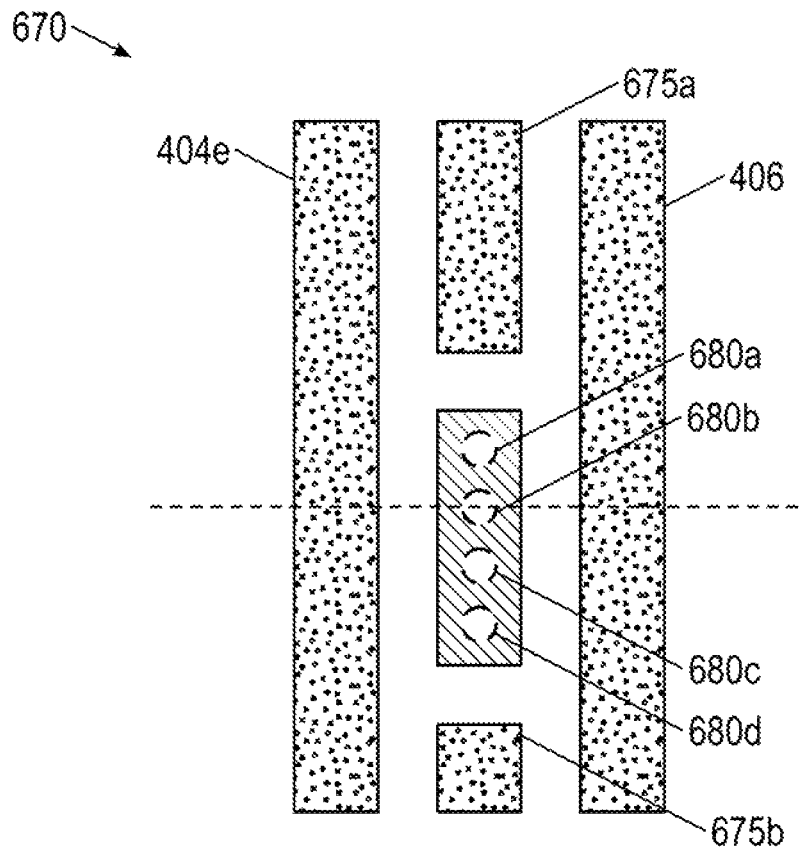
FIG. 6D illustrates a schematic top view of the resulting solid metallized film shown in FIG. 6C, illustrating an arrangement of dielectric backfilled sections in accordance with one or more embodiments of the disclosure.

The treatment of the solid metallized film 600 can yield a solid metallized film 630 (as is shown in FIG. 6B) defining an opening 636 that, in view of the removal of the metal portion, is a larger than the opening 606 utilized or otherwise leveraged for such a treatment. Similar to other embodiments of this disclosure, the solid metallized film 630 can be treated to fill the opening 636 with a dielectric material. To such an end, in one implementation, an amount of the dielectric material can be deposited on the solid metallized film 630, where the amount of the dielectric material that is deposited can cover the opening 636 and can form an overburden layer (not depicted in FIG. 6C) on the HM layer 604. The overburden layer, the HM layer 604, and the ES layer 602 can be removed by chemical and/or mechanical polishing of such structures, resulting in a substantially planar surface normal to the stacking direction. Therefore, the described treatment of solid metallized film 630 can yield a solid metallized film 650 having a dielectric member 660, as is illustrated in FIG. 6C. In some implementations, the HM layer 604 can define multiple tubular openings. Specifically, in one example, such openings can include opening 680a, opening 680b, opening 680c, and opening 680d, each having a circular cross-section, as is shown in FIG. 6D.

Figure 7A:
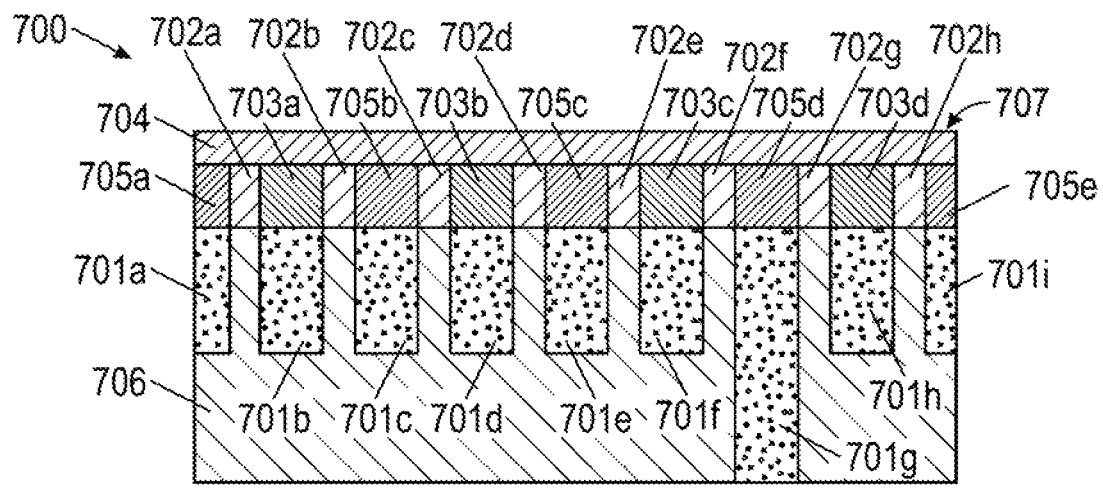
FIGS. 7A-7L illustrate schematic cross-sectional views representative of stages of yet another example process for selectively removing a float interconnect in accordance with one or more embodiments of the disclosure.
Figure 7B:
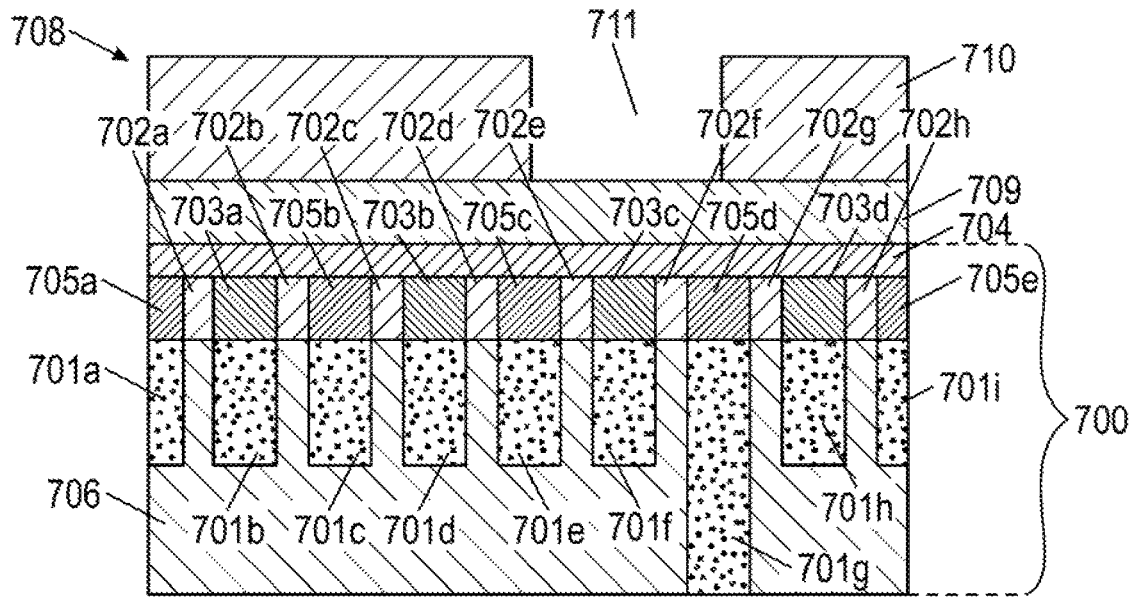

A combination of multiple hard mask layers can be utilized to provide increase design flexibility and to permit the selective removal of metal from different regions of a metallized film. To that point, FIGS. 7A-7L illustrate schematic cross-sectional views representative of stages of an example process for selectively removing metal from more than one metal interconnect in accordance with one or more embodiments of the disclosure. Specifically, FIG. 7A illustrates a schematic cross-sectional view of an example solid metallized film 700 that can permit selectively removing an amount of metal or another type of conductive material that embodies or constitutes a float interconnect. The solid metallized film 700 can constitute a semiconductor die that is being formed according to a defined POR. As illustrated, the solid metallized film 700 includes a dielectric structure 706 that can embody or can constitute an ILD structure or an IMD structure. The solid metallized film 700 also can have multiple conductive interconnects, including a metal interconnect 701a, a metal interconnect 701b, a metal interconnect 701c, a metal interconnect 701d, a metal interconnect 701e, a metal interconnect 701f, a metal interconnect 701g, a metal interconnect 701h, and a metal interconnect 701i. The metal interconnect 701g can be, for example, a power interconnect included in a power distribution network (PDN), where the power interconnect can embody or can constitute, in some embodiments, a via configured at a high voltage. As illustrated, a first type of hard mask members can respectively cap (or otherwise cover) a subset of the metal interconnects of the multiple conductive interconnects. Specifically, a hard mask member 702a caps the metal interconnect 701a; a hard mask member 702b caps the metal interconnect 701c; a hard mask member 702c caps the metal interconnect 701e; a hard mask member 702d caps the metal interconnect 701g; and a hard mask member 701e caps the metal interconnect 701i. In addition, a second type of hard mask members can respectively cap (or otherwise cover) a second subset of the metal interconnects of the multiple conductive interconnects. Specifically, a hard mask member 703a caps the metal interconnect 701b; a hard mask member 703b caps the metal interconnect 701d; a hard mask member 703c caps the metal interconnect 701f; and a hard mask member 703d caps the metal interconnect 701h.

Further, a third type of hard mask members is intercalated with the first type and second type of hard mask members. Specifically, a hard mask member 702a is adjacent to the hard mask member 705a and is further adjacent to the hard mask member 703a; a hard mask member 702b is adjacent to the hard mask member 703a and is further adjacent to the hard mask member 705b; a hard mask member 702c is adjacent to the hard mask member 705b and is further adjacent to the hard mask member 703b; a hard mask member 702d is adjacent to the hard mask member 703b and is further adjacent to the hard mask member 705c; a hard mask member 702e is adjacent to the hard mask member 705c and is further adjacent to the hard mask member 703c; a hard mask member 702f is adjacent to the hard mask member 703c and is further adjacent to the hard mask member 705d; a hard mask member 702g is adjacent to the hard mask member 705d and is further adjacent to the hard mask member 703d; and a hard mask member 702h is adjacent to the hard mask member 703d and is further adjacent to the hard mask member 705e.

The solid metallized film 700 also can include an etch stop layer 704 or another type of barrier layer that can prevent or otherwise mitigate migration of metal ions from the metal interconnects 701a-701i to another layer of dielectric material that may be formed on the upper surface of the solid metallized film 700.

The solid metallized film 700 can be treated to form a HM layer 707 on the upper surface 707 of the ES layer 704. Subsequent to the formation of the HM layer 707, the resulting solid film (not depicted) can be treated to form a photoresist mask layer 710 on an upper surface of the HM layer 704, resulting in the solid metallized film 707 shown in FIG. 7B. The photoresist mask layer 710 can define an opening 711 that exposes a portion of the upper surface of the HM mask 709. In some implementations, treating the solid metallized film 700 can include depositing an amount of photoresist on the upper surface 417, and patterning the amount of photoresist to form the opening 711. The patterning can determine the position of the opening 711 on the upper surface of the HM mask 709. Thus, in some aspects, the patterning can determine a section of the solid metallized film 700 that may be removed, including a metal interconnect within the solid metallized film 700. In the illustrated example, the opening 711 can permit or otherwise facilitate the removal of the metal interconnect 701f in accordance with aspects described herein.

Figure 7C:
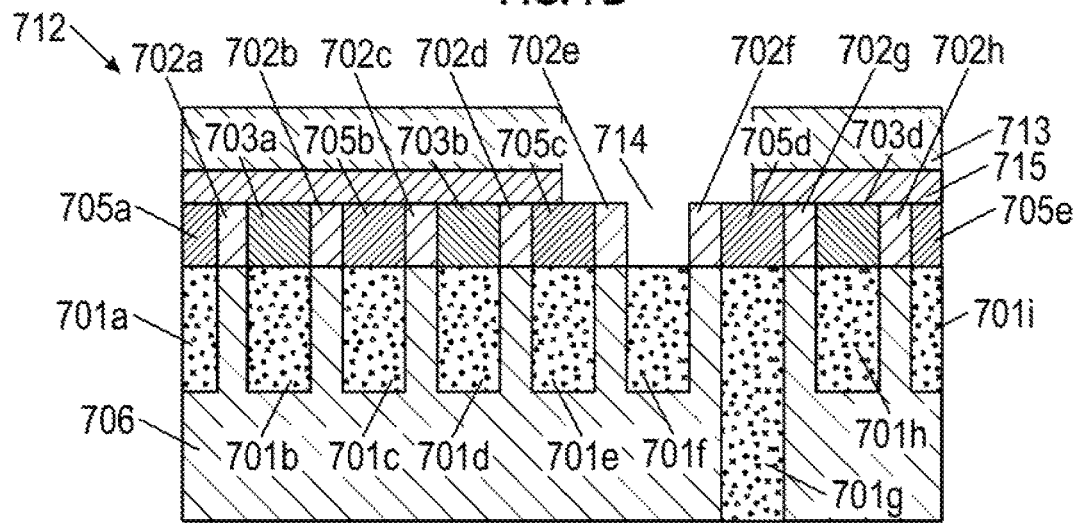

The solid metallized film 707 can be treated to remove a portion of the solid metallized film 700 underlying the HM layer 709 and the photoresist mask layer 710, resulting in the solid film 712 shown in FIG. 7C. In one implementation, treating the solid metallized film 707 can include etching a portion of the HM layer 709 and etching a portion of the ES layer 704 to transfer a feature determined by the cross-section, in the x-y plane, of the opening 711 to the HM layer 709 and the ES layer 704. As such, in one example, the etching can yield a treated HM layer 713 and a treated ES layer 715, which layers can collectively define an opening that exposes an upper surface of the HM member 703c, an upper surface of the HM member 702e, and an upper surface of HM member 702f. Similar to other treatments described herein, etching the portion of the HM layer 709 can include, in one implementation, subjecting the HM layer 709 to one of a first dry etch process or a first wet etch process. Similarly, etching the portion of the ES layer can include, in one implementation, subjecting the ES layer 704 to one of a second dry etch process or a second wet etch process. The dielectric material that forms or otherwise constitutes the HM layer 709 can be different from another dielectric material that forms or otherwise constitutes the ES layer 704, and therefore, the HM layer 709 and the ES layer 704 can provide respective types of etch selectivity. Accordingly, in one aspect, the first dry etch process and the second dry etch process can be specific to the HM layer 709 and the ES layer 704, respectively. Likewise, in another aspect, the first wet etch process and the second wet etch process can be specific to the HM layer 709 and the ES layer 704, respectively. The etch processes (e.g., the first dry etch process, the second dry etch process, the first wet etch process, and/or the second etch process) utilized or otherwise leveraged to treat the HM layer 709 and the ES layer 704 can be implemented for a time interval configured to permit the exposure of respective upper surfaces the HM member 703c, the HM member 702e, and the HM member 702f.

The opening (not depicted) that is collectively defined by the treated HM layer 713 and a treated ES layer 715 can permit or otherwise facilitate further treatment of at least the portion of the solid metallized film 700 that is exposed by such an opening. More specifically, the HM member 703c can be removed, for example, by subjecting the exposed portion of solid metallized film 700 to a dry etch process. In one aspect, the dry etch process is specific to the dielectric material that forms or otherwise constitutes the HM member 703. Therefore, an upper surface of the metal interconnect underlying the HM member 703 can be selectively exposed, as is shown in FIG. 7C.

Figure 7D:
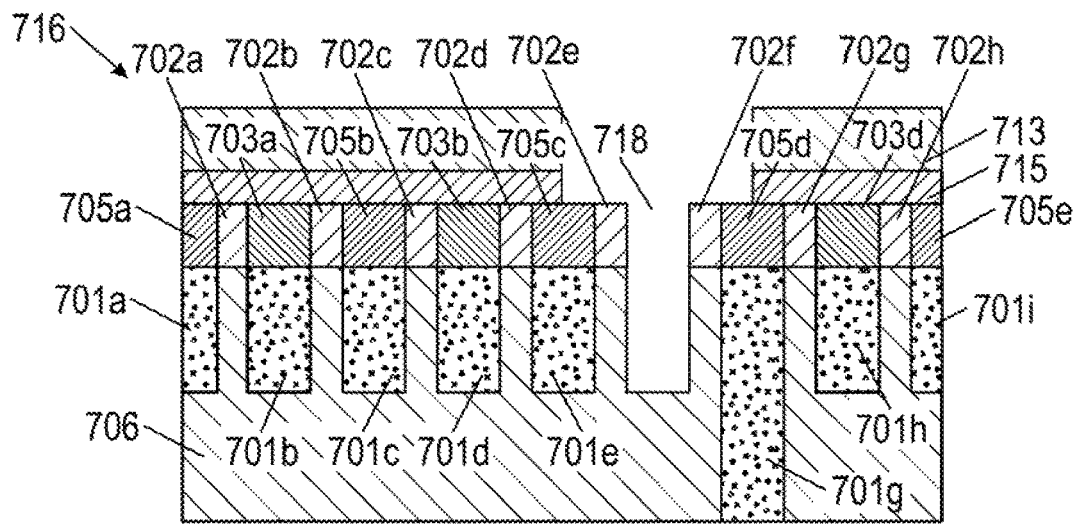

As illustrated in FIG. 7C, removal of the HM member 703 yields an opening 714, which can be utilized or otherwise leveraged for further treatment of the solid metallized film 712 shown in FIG. 7C. In some implementations, an etch process can be utilized to treat the solid metallized film 712. More specifically, treating the solid metallized film 712 can include, in one example, subjecting the metal interconnect 701f to a wet etch process. In some aspects, the etching can yield a solid metallized film 445 that defines an opening 718, as is illustrated in FIG. 4D. Therefore, similarly to other solid films of the disclosure, treating the solid metallized film 712 in accordance with aspects of this disclosure can yield a solid metallized film 716 as is shown in FIG. 7D. The solid metallized film 716 selectively lacks at least a portion of a metal interconnect present in the precursor solid metallized film 700 illustrated in FIG. 7A.

Figure 7E:
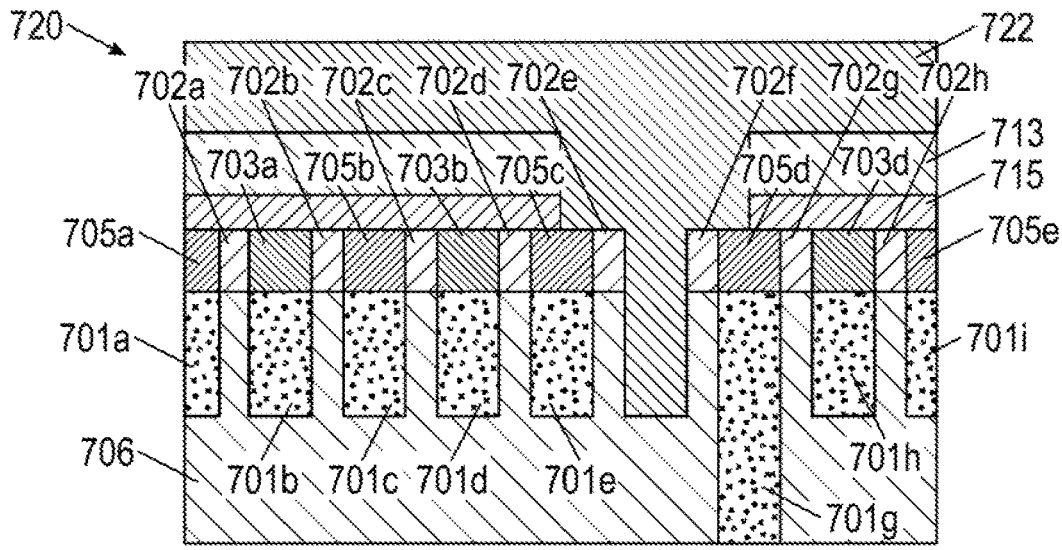
Figure 7F:
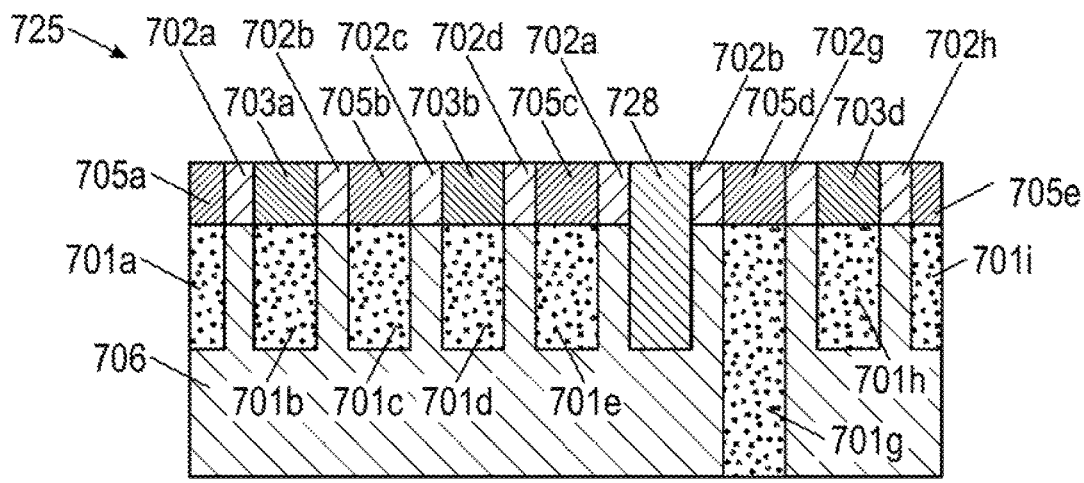

The solid metallized film 716 can be further treated to fill the opening 718 with a dielectric material. Treating the solid metallized film 716 can include depositing an amount of the dielectric material, where the amount of the dielectric material that is deposited can cover the opening 718 and can form an overburden layer on the treated HM layer 713. Therefore, the further treatment of the solid metallized layer 715 can yield a solid metallized film 720 having a dielectric structure 722, as is illustrated in FIG. 7E.

The overburden layer that constitutes the dielectric structure 722 and/or any other excess dielectric material that caps or otherwise coats the solid metallized film 716 can be polished (chemically and/or mechanically) or otherwise can be removed. The resulting film can be further polished (chemically and/or mechanically) to remove the treated HM layer 713, the treated ES layer 715, and additional dielectric material in order to form the solid metallized film 725 illustrated in FIG. 7F. As such, the solid metallized film 725 can have a substantially flat surface and includes a dielectric member 728 placed between adjacent metal interconnects, e.g., metal interconnect 701e and metal interconnect 701g.

Figure 7G:
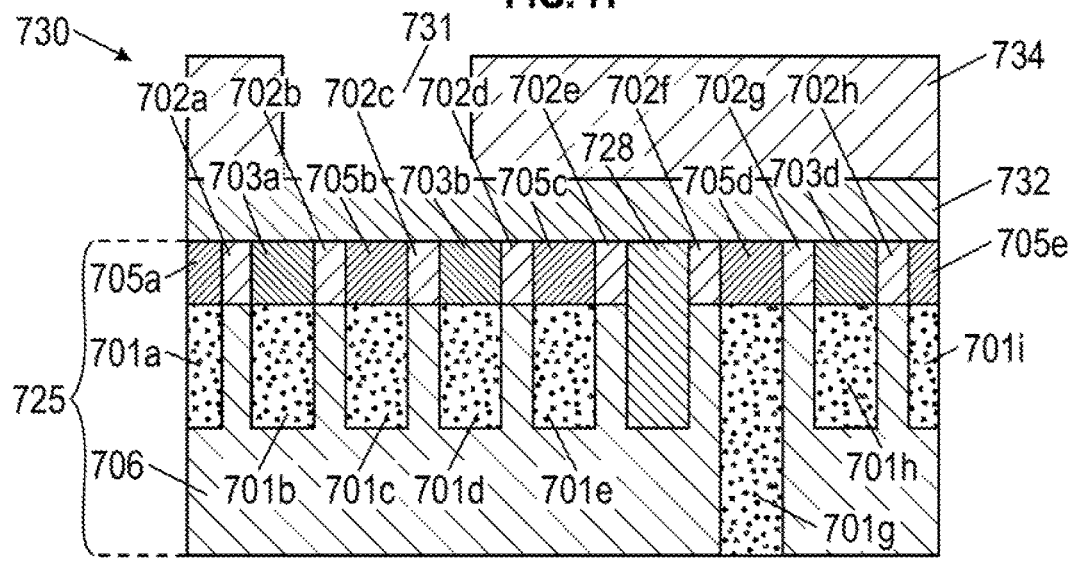

As mentioned, the different types of hard mask material included in the initial solid metallized film 700 can be leveraged to selectively remove amounts of metal placed in different regions of the film. Specifically, in the illustrated example process associated with FIGS. 7A-7L, the second type of HM material can be leveraged to remove the metal interconnect 701c in addition to the removal of the metal interconnect 701f as described hereinbefore. To that end, the solid metallized film 725 can be treated to yield a solid metallized film 730 as is illustrated in FIG. 7G. The solid metallized film 730 includes a HM layer 736 that coats the upper surface of the precursor solid metallized film 725. The solid metallized film also includes a PR mask layer 734 that defines an opening 731 that exposed a portion of the upper surface of the HM layer 736.

Figure 7H:
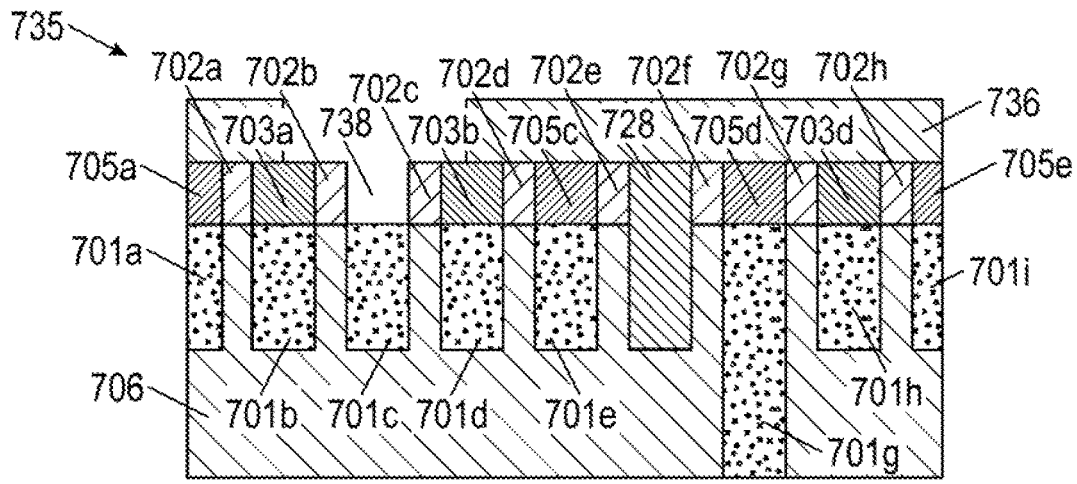

The solid metallized film 730 can be treated to remove a portion of the solid metallized film 725 underlying the HM layer 736 and the photoresist mask layer 734, resulting in the solid film 735 shown in FIG. 7H. In one implementation, treating the solid metallized film 730 can include etching a portion of the HM layer 736 to transfer a feature determined by the cross-section (in the x-y plane) of the opening 711 to the HM layer 709. After the feature is transferred, the PR mask layer 734 can be removed chemically and/or mechanically. Regardless of the removal of the PR mask layer 734, the etching of the portion of the HM layer 736 can yield a treated HM layer 736 that defines an opening that exposes an upper surface of the HM member 705b, an upper surface of the HM member 702b, and an upper surface of HM member 702c. Such an opening also exposes respective portions of the upper surface of the HM member 703a and the upper surface of the HM member 703b. Similar to other treatments described herein, etching the portion of the HM layer 736 can include, in one implementation, subjecting the HM layer 736 to one of a dry etch process or a wet etch process. The etch processes (e.g., the dry etch process or the wet etch process) utilized or otherwise leveraged to treat the HM layer 736 can be implemented for a time interval configured to permit the exposure of respective upper surfaces the HM member 705b, the HM member 702b, and the HM member 702c. Further, in one aspect, the treated HM layer 736 can permit removing the HM member 705b by subjecting the HM member 705b to, for example, a dry etch process that selectively reacts with, and breaks down, the dielectric material that constitutes the HM member 705b. As illustrated in FIG. 7H, the removal of the HM member 705b can form an opening 738 that exposes at least a portion of the upper surface of the metal interconnect 705c.

Figure 7I:
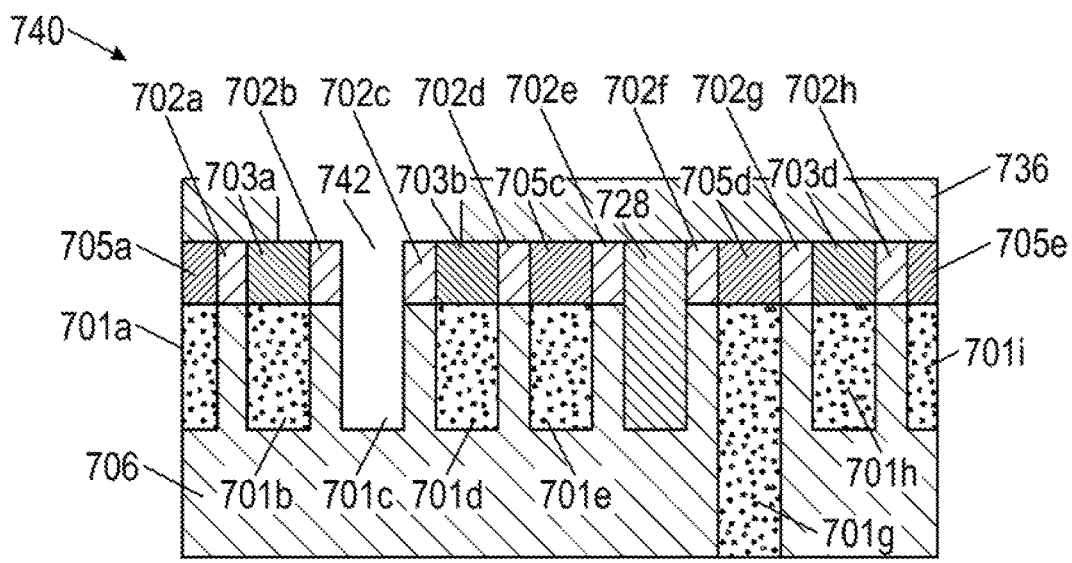

The opening 738 can permit or otherwise facilitate treatment of the solid metallized film 735. In some implementations, an etch process can be utilized to treat the solid metallized film 735 in order to remove at least a portion of the metal interconnect 705c. To that end, in one implementation, the metal interconnect 705c can be subjected to a wet etch process. As mentioned, application of the wet etch process can provide greater selectivity than the application of a dry etch process. Notwithstanding, in other implementations, depending on the depth (or extent of along the z direction) of the metal interconnect 705c, a dry etch process can be implemented. Regardless of the type of etch process, etching the metal interconnect 705c can yield a solid metallized film 740 that defines an opening 718, as is illustrated in FIG. 7I. Therefore, similarly to other solid films of the disclosure, treating the solid metallized film 735 in accordance with aspects of this disclosure can yield a solid metallized film 740 that selectively lacks at least a portion of a metal interconnect present in the precursor solid metallized film 725 illustrated in FIG. 7F.

Figure 7J:
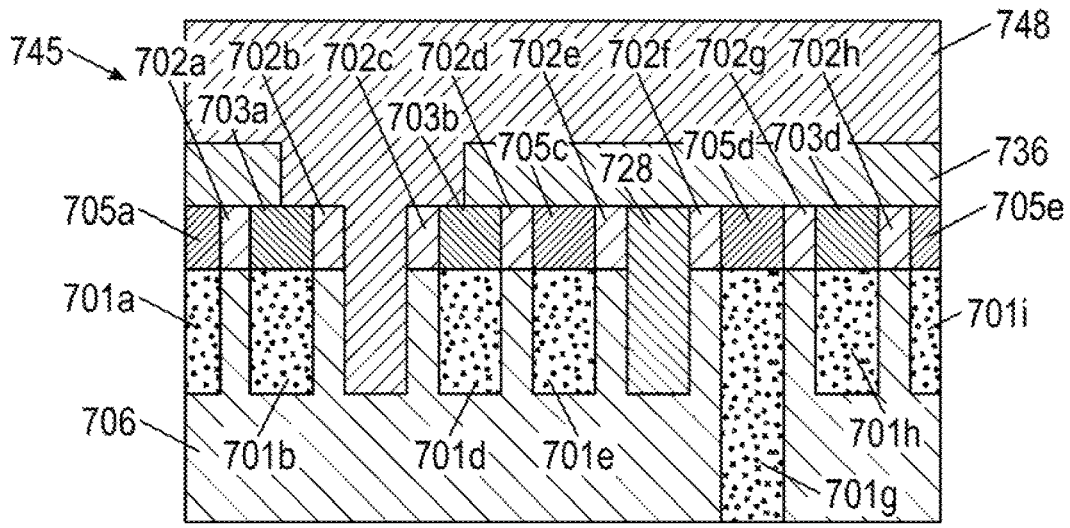
Figure 7K:
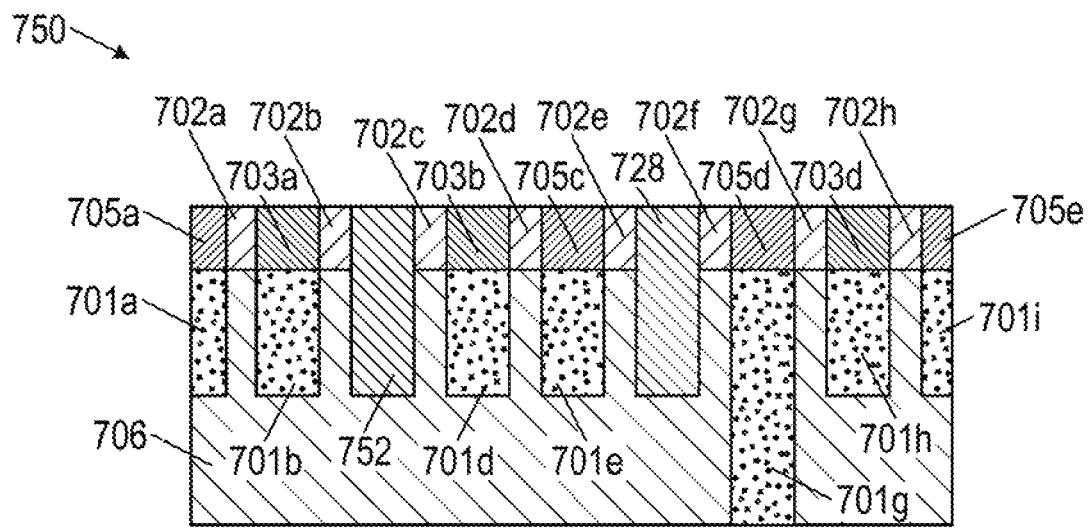

The solid metallized film 740 can be further treated to fill the opening 742 with a dielectric material. Treating the solid metallized film 740 can include depositing an amount of the dielectric material, where the amount of the dielectric material that is deposited can cover the opening 742 and can form an overburden layer on the treated HM layer 736. Therefore, the further treatment of the solid metallized layer 735 can yield a solid metallized film 745 having a dielectric structure 748, as is illustrated in FIG. 7J.

The overburden layer that constitutes the dielectric structure 748 and/or any other excess dielectric material that caps or otherwise coats the solid metallized film 740 can be polished (chemically and/or mechanically) or otherwise removed. As mentioned, the overburden layer can simplify the polishing of the solid metallized film 740. The resulting film can be further polished (chemically and/or mechanically) to remove the treated HM layer 736 and any additional dielectric material in order to form the solid metallized film 750 illustrated in FIG. 7K. As such, the solid metallized film 725 can have a substantially flat surface and includes a dielectric member 752 located between first adjacent metal interconnects (e.g., metal interconnect 701b and metal interconnect 701d) and the dielectric member 728 located between second adjacent metal interconnects (e.g., metal interconnect 701e and metal interconnect 701g) Each one of the dielectric member 728 and the dielectric member 752 can permit or otherwise facilitate avoiding electrical short circuit of neighboring metal interconnects, reducing capacitive cross-talk between neighboring metal interconnects, and/or reducing charging of the solid metallized film 755.

Figure 7L:
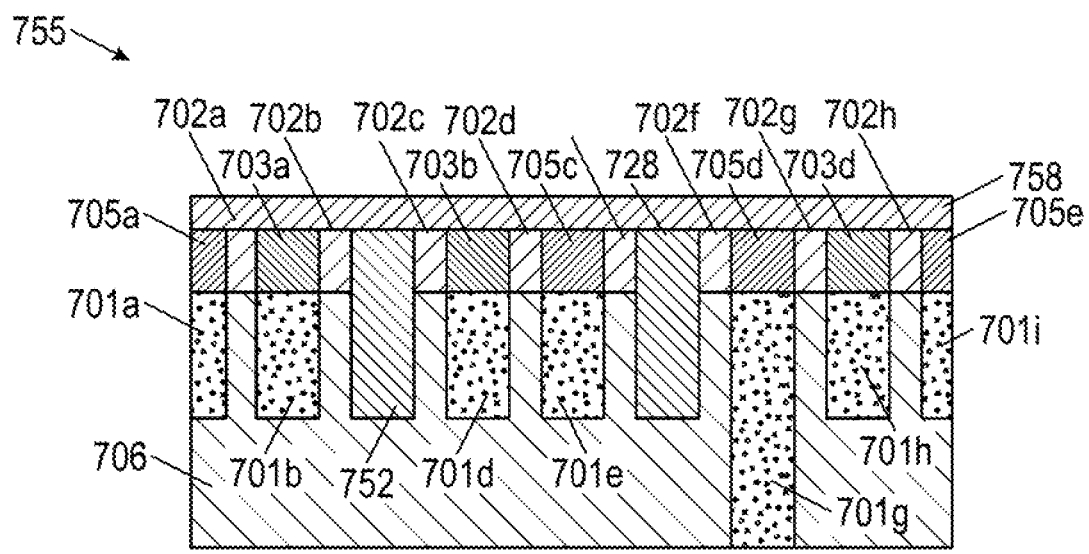

The solid metallized film 750 can be treated to form an ES layer 758 (or, in some embodiments, another type of barrier layer), resulting in a solid metallized film 755 as is illustrated in FIG. 7L. Similar to other ES layers of this disclosure, the ES layer 492 can prevent or otherwise mitigate migration of metal ions from the one or more of the metal interconnects 701a-701i to another layer of dielectric material that may be formed on the upper surface of the solid metallized film 755. It is noted that the solid thin film 755 can continue to be processed according to the POR that yielded the precursor solid thin film 700, without the shortcomings or potential complications arising from power interconnects adjacent to float interconnects utilized in conventional high-voltage applications.

It is noted that the cross-sectional views respectively illustrated in FIGS. 7G-7L represent resulting solid metallized films that can be formed or otherwise accomplished via additional optional processing stages that can permit forming a second backfilled dielectric member (e.g., dielectric member 752). These optional steps need not be implemented in each treatment or processing of a precursor solid metallized film (e.g., solid metallized film 700), but instead the implementation of such processing stages can be based at least on the particular interconnectivity that is intended to be accomplished by the metal interconnects (e.g., metal lines, metal posts, metal vias, and the like) present in the integrated circuitry being fabricated.

As described herein, the utilization of multiple types of hard mask members can be referred to as multicolor patterning scheme. In such a scheme, metal interconnects can be in contact with or in proximity to hard mask members of different types, where the hard mask members can be removed selectively with respect to each other. The selective removal of the hard mask members can permit, in some aspects, developing different arrangements of backfilled dielectric members, depending on a particular type of metal interconnects intended to be removed in order to reduce or avoid the issues associated with having high voltage tight-pitch (also referred to as a closely-spaced) metal interconnects. The multicolor patterning scheme can be implemented using metal pieces, direct self-assembly, or selective growth (such as MBE growth) or other types of techniques that permit the monolithic fabrication of a precursor solid metallized film.

In addition, an alternative multicolor patterning scheme also can increase process tolerance to CD or registration errors as the patterning for removal of a float interconnect can be larger and more likely to be misaligned to the patterning below. As a result, the presence of different hard mask members can add resilience to the various processes directed to removing selected materials from a precursor solid metallized film that is being treated.

In some embodiments, various combinations of hard mask materials can be utilized. In some implementations, two-color hard masks can be used. In other implementations, three-color hard masks can be utilized. In yet other implementations, other multicolor hard masks including more than three types of HM materials can be utilized. It still other implementations, monochromatic hard mask members also can be utilized. In order to introduce etch stops above a metal line, where a metal line can include one or more extended bias, such as a trench or a localized bias such as a tubular filler or other type of post or column made of a conductive material.

Figure 8A:
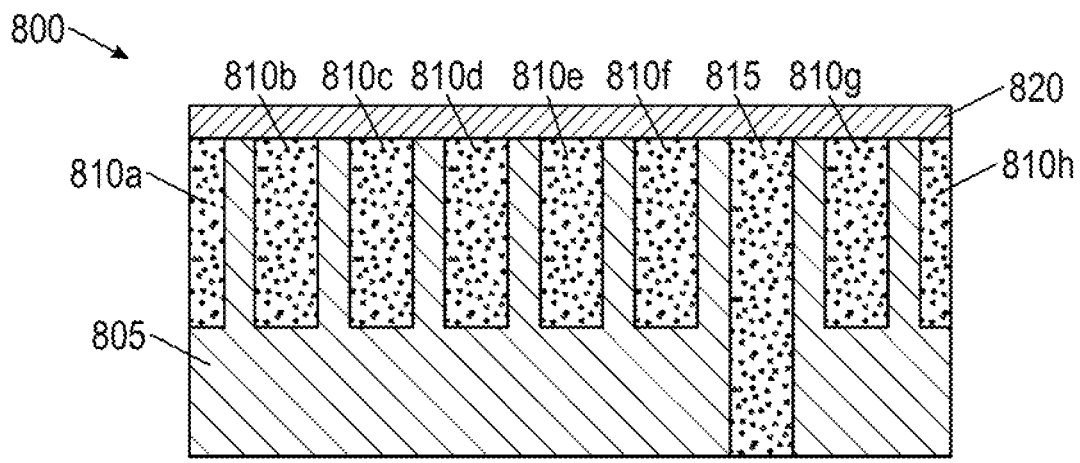
FIGS. 8A-8C illustrate schematic cross-sectional views representative of stages of an example process for selectively removing a float interconnect in accordance with one or more embodiments of the disclosure. Specifically.
Figure 8B:
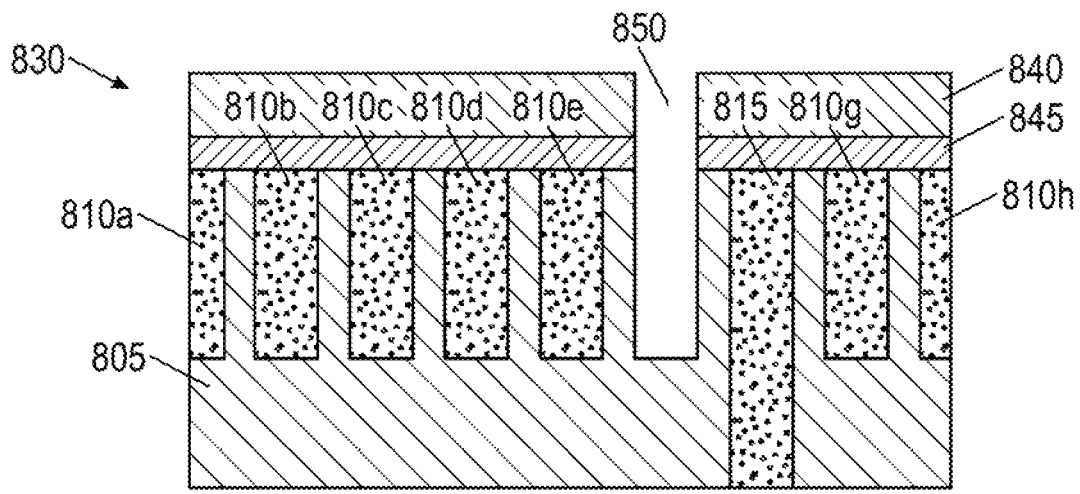
Figure 8C:
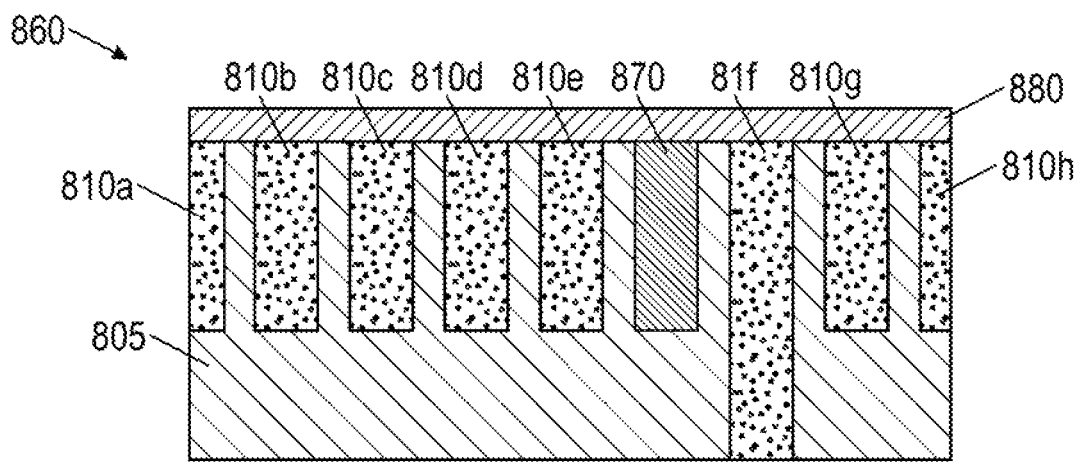

As a reference, FIGS. 8A-8C illustrate schematic cross-sectional views representative of stages of an example process for selectively removing at least a portion of a float interconnect in accordance with one or more embodiments of the disclosure. In one aspect, the example process does not rely on HM members. More specifically, FIG. 8A illustrates a schematic cross-sectional view of a solid metallized film 800 in accordance with one or more embodiments of the disclosure. The solid metallized film 800 includes a dielectric structure 805 having embedded therein conductive interconnects, including a metal interconnect 810a, a metal interconnect 810b, a metal interconnect 810c, a metal interconnect 810d, a metal interconnect 810e, a metal interconnect 810f, a metal interconnect 810g, and a metal interconnect 810h. The conductive interconnects also can include a power interconnect 815 which can embody or can constitute, in some embodiments, a via configured at a high voltage. The via can be configured for inclusion in a PDN. In some aspects, the power interconnect 815 can include or can form, for example, an interlayer interconnect that can be configured at high voltage or another defined voltage in the PDN. In addition, the solid metallized film 800 also includes an ES layer 820 or another type of barrier layer that can prevent or otherwise mitigate migration of metal ions from one or more of the metal interconnects 810a-810h and metal interconnect 815 to another layer of dielectric material that may be formed on the upper surface of the solid metallized film 800.

The solid metallized film 800 can be treated to form a solid metallized film 830 that defines an opening 850, as illustrated in FIG. 8B. Treating the solid metallized film 800 can include depositing a HM layer on an upper surface of the ES layer 820, and subjecting the HM layer to a wet etch process or a dry etch process. To that end, in accordance with aspects described herein, a PR mask layer (not depicted) can be deposited on an upper surface of the HM layer and patterned to define an opening that permits etching the HM layer, resulting in the treated HM layer 845. The treated HM layer 845 can expose a portion of the upper surface of the ES layer 820 and can be utilized to remove a portion of the ES layer 820, yielding a treated ES layer 845. The treated HM layer 840 and the ES layer 845 can collectively define at least a portion of the opening 850. Prior to the formation of the opening 850, an exposed portion of the upper surface of the metal interconnect 810f can be treated to remove the metal interconnect 810f. Treating the metal interconnect 810f can include subjecting the metal interconnect 810f to a wet etch process, for example, forming the remaining portion of the opening 850.

The solid metallized film 830 can be treated to fill at least a portion of the opening 850 in accordance with aspects described herein to yield the solid metallized film 860 illustrated in FIG. 8C. More specifically, the treatment can include deposition of a dielectric material, which is utilized to form a dielectric member 870. The treatment also can include deposition of an ES layer 880. As disclosed herein, the formation of the ES layer 880 can permit further processing of the solid metallized film 860 according to a defined POR associated with an intended or otherwise desired integrated circuitry.

Figure 9A:
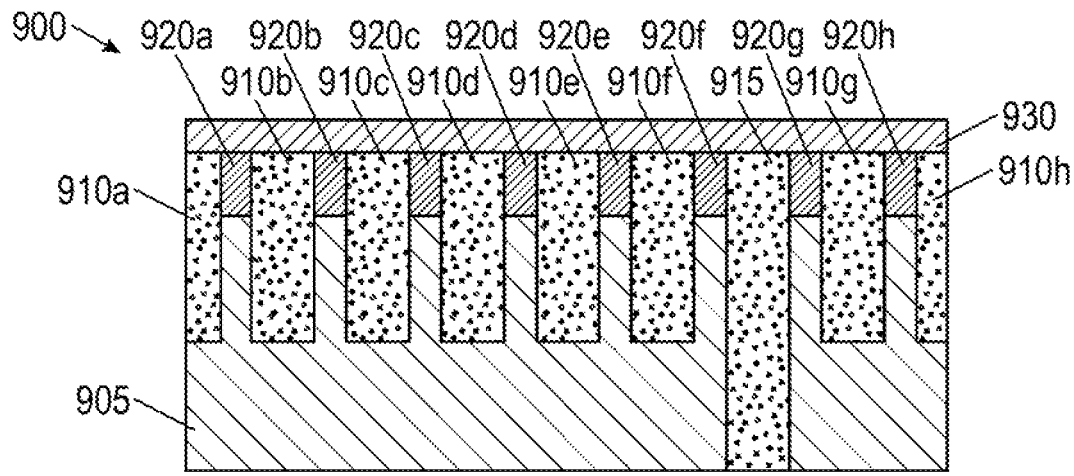
FIGS. 9A-9C illustrate schematic cross-sectional views representative of stages of an example process for selectively removing a float interconnect in accordance with one or more embodiments of the disclosure. Specifically.
Figure 9B:
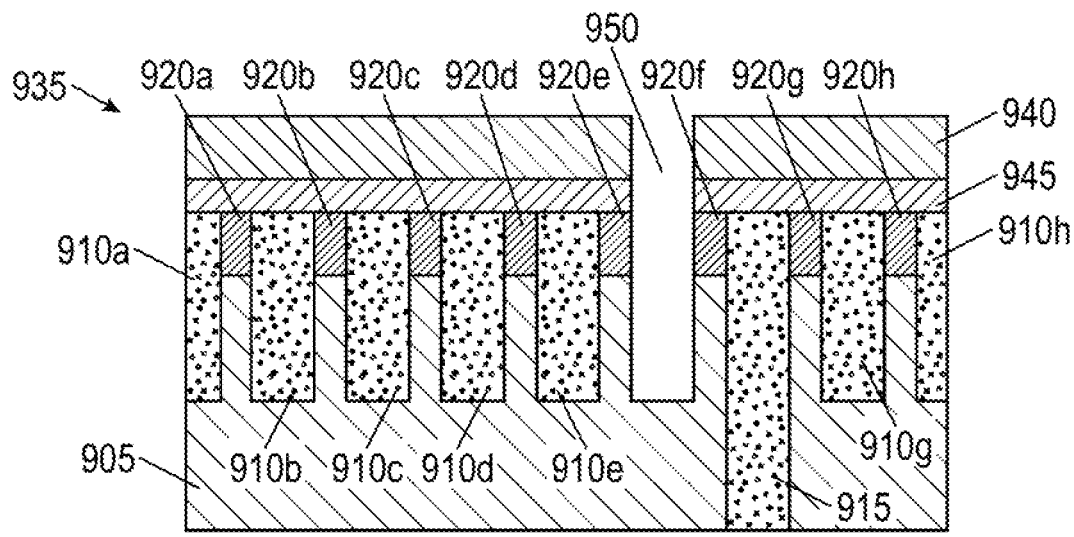
Figure 9C:
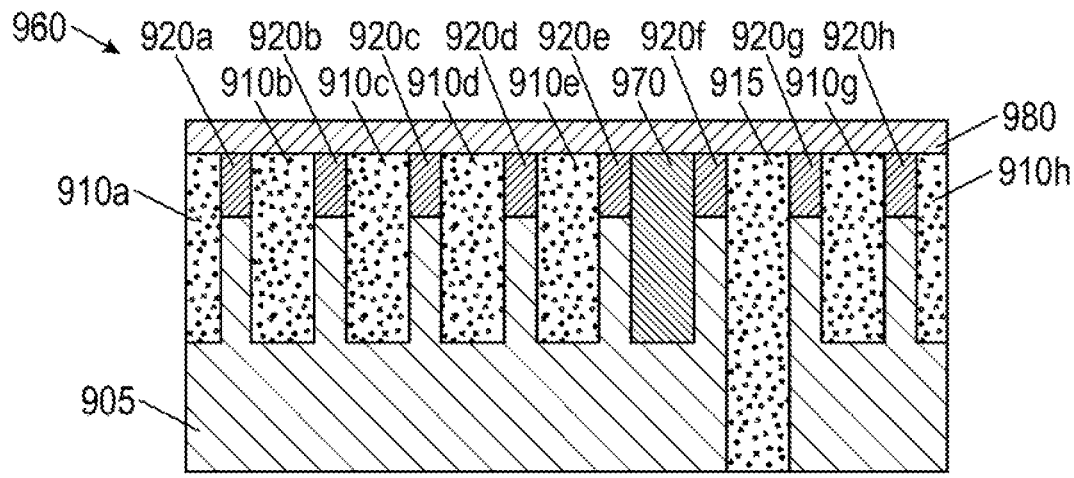

Without intending to be bound by design considerations, the etching selectivity in the solid metallized film 860 is determined mainly by the dielectric material of the ES layer 820 because of the absence of hard mask members in the solid metallized film 860. To that point, in some aspects, addition of monochromatic hard mask members can be utilized to increase etching selective and/or processing tolerance. As an illustration, FIGS. 9A-9C present schematic cross-sectional views representative of stages of an example process for selectively removing a float interconnect in accordance with one or more embodiments of the disclosure. Specifically, FIG. 9A illustrates a schematic cross-sectional view of a solid metallized film 900 having monochromatic hard mask members in accordance with one or more embodiments of the disclosure. The solid metallized film 900 includes a dielectric structure 905 having embedded therein conductive interconnects, including a metal interconnect 910a, a metal interconnect 910b, a metal interconnect 910c, a metal interconnect 910d, a metal interconnect 910e, a metal interconnect 910f, a metal interconnect 910g, and a metal interconnect 910h. The conductive interconnects also can include a power interconnect 915 which can embody or can constitute, in some embodiments, a via configured at a high voltage. The via can be configured for inclusion in a PDN. In some aspects, the power interconnect 915 can include or can form, for example, an interlayer interconnect that can be configured at high voltage or another defined voltage in the PDN. In addition, the solid metallized film 900 also includes an ES layer 930 or another type of barrier layer that can prevent or otherwise mitigate migration of metal ions from one or more of the metal interconnects 910a-910h and metal interconnect 915 to another layer of dielectric material that may be formed on the upper surface of the solid metallized film 900.

In addition, the solid metallized film 900 can include a group of hard mask members intercalated with the conductive interconnects embedded in the solid metallized film 900. As illustrated, the group of hard mask members can include hard mask member 920a, hard mask member 920b, hard mask member 920c, hard mask member 920d, hard mask member 920e, hard mask member 920f, and hard mask member 920g intercalated with metal interconnects 910a-910h.

The solid metallized film 900 can be treated to form a solid metallized film 930 that defines an opening 950, as illustrated in FIG. 9B. Treating the solid metallized film 900 can include depositing a HM layer on an upper surface of the ES layer 930, and subjecting the HM layer to a wet etch process or a dry etch process to form or otherwise transfer a defined feature onto the HM layer. To that end, in accordance with aspects described herein, a PR mask layer (not depicted) can be deposited on an upper surface of the HM layer, and patterned to define an opening that permits etching the HM layer, resulting in the treated HM layer 940. The treated HM layer 940 can expose a portion of the upper surface of the ES layer 930 and can be utilized to remove a portion of the ES layer 930, yielding a treated ES layer 945. The treated HM layer 940 and the ES layer 945 can collectively define at least a portion of the opening 950. In one aspect, prior to the formation of the opening 850, an exposed portion of the upper surface of the metal interconnect 910f can be treated to remove the metal interconnect 910f. Treating the metal interconnect 910f can include subjecting the metal interconnect 910f to a wet etch process, for example, forming the remaining portion of the opening 950.

The solid metallized film 930 can be treated to fill at least a portion of the opening 950 in accordance with aspects described herein to yield the solid metallized film 960 illustrated in FIG. 9C. More specifically, the treatment can include deposition of a dielectric material, which is utilized to form a dielectric member 970. The treatment also can include deposition of an ES layer 980. As disclosed herein, the formation of the ES layer 980 can permit further processing of the solid metallized film 960 according to a defined POR associated with an intended or otherwise desired chipset having integrated circuitry.

Figure 10A:
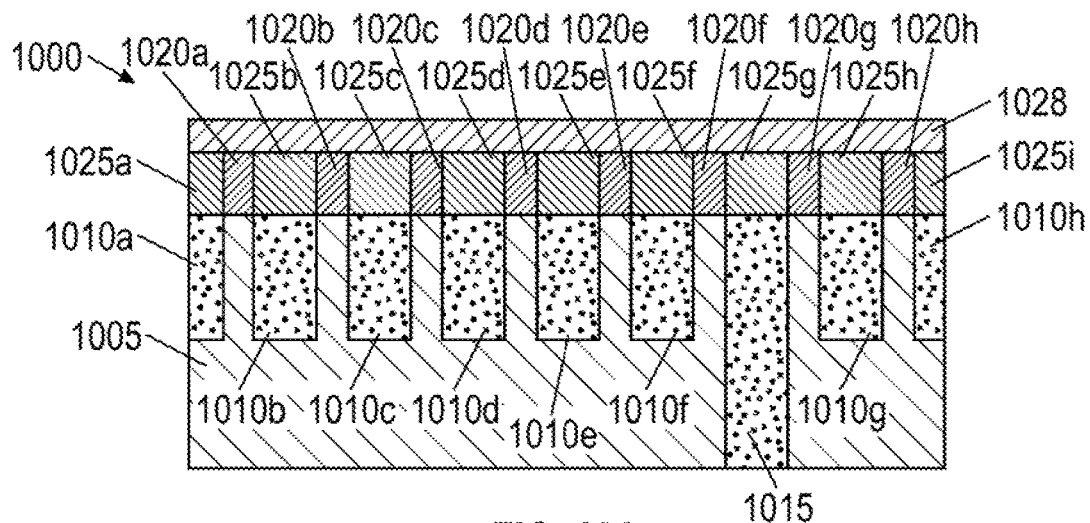
FIGS. 10A-10C illustrate schematic cross-sectional views representative of stages of an example process for selectively removing a float interconnect in accordance with one or more embodiments of the disclosure. Specifically.
Figure 10B:
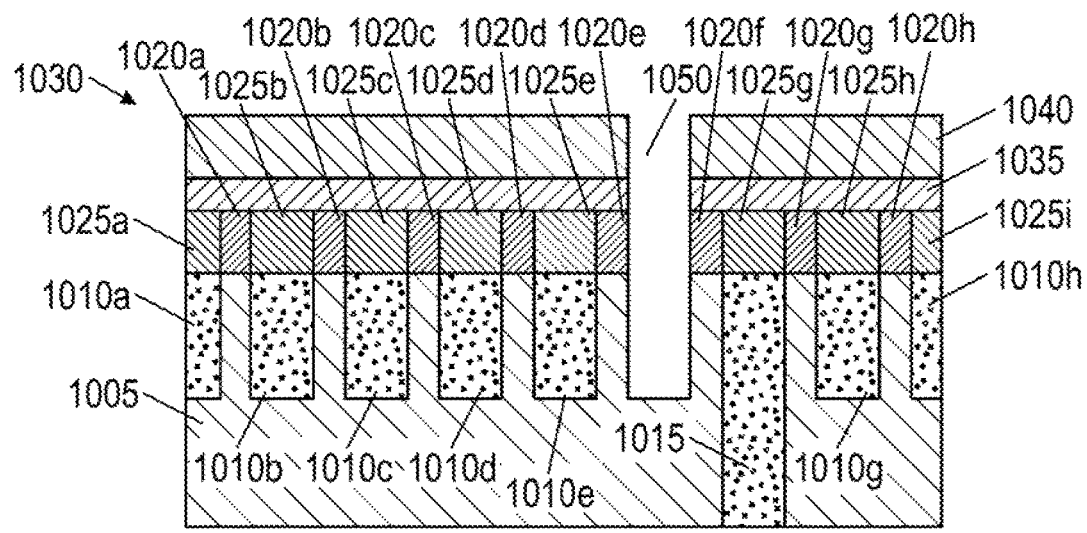
Figure 10C:
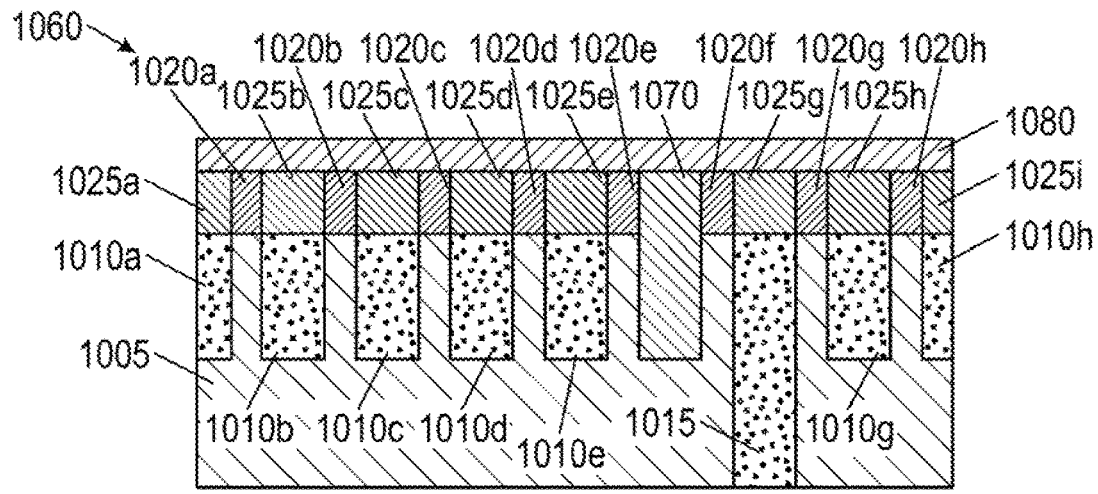

FIGS. 10A-10C illustrate schematic cross-sectional views representative of stages of an example process for selectively removing a float interconnect in accordance with one or more embodiments of the disclosure. Specifically, FIG. 10A illustrates a schematic cross-sectional view of solid metallized film 1000 having two-color patterning including a first type of hard mask members and a second type of hard mask members in accordance with one or more embodiments of the disclosure. The solid metallized film 1000 includes a dielectric structure 1005 having embedded therein multiple conductive interconnects, including a metal interconnect 1010a, a metal interconnect 1010b, a metal interconnect 1010c, a metal interconnect 1010d, a metal interconnect 1010e, a metal interconnect 1010f, a metal interconnect 1010g, and a metal interconnect 1010h. The conductive interconnects also can include a power interconnect 1015 which can embody or can constitute, in some embodiments, a via configured at a high voltage. The via can be configured for inclusion in a PDN. In some aspects, the power interconnect 1015 can include or can form, for example, an interlayer interconnect that can be configured at high voltage or another defined voltage in the PDN. In addition, the solid metallized film 1000 also includes an ES layer 1028 or another type of barrier layer that can prevent or otherwise mitigate migration of metal ions from one or more of the metal interconnects 1010a-1010h and the metal interconnect 1015 to another layer of dielectric material that may be formed on the upper surface of the solid metallized film 1000.

As illustrated in FIG. 10A, a first type of hard mask members can respectively cap (or otherwise cover) a subset of the metal interconnects of the multiple conductive interconnects. Specifically, a hard mask member 1025a caps the metal interconnect 1010a; a hard mask member 1025b caps the metal interconnect 1010b; a hard mask member 1025c caps the metal interconnect 1010c; a hard mask member 1025d caps the metal interconnect 1010d; a hard mask member 1025e caps the metal interconnect 1010e; a hard mask member 1025f caps the metal interconnect 1010f; a hard mask member 1025g caps the metal interconnect 1010g; and a hard mask member 1025h caps the metal interconnect 1010h. In addition, a second type of hard mask members is intercalated with the first type of hard mask members. Specifically, a hard mask member 1020a is adjacent to the hard mask member 1025a and is further adjacent to the hard mask member 1025a; a hard mask member 1020b is adjacent to the hard mask member 1025b and is further adjacent to the hard mask member 1025c; a hard mask member 1020c is adjacent to the hard mask member 1025c and is further adjacent to the hard mask member 1025d; a hard mask member 1020d is adjacent to the hard mask member 1025d and is further adjacent to the hard mask member 1025e; a hard mask member 1020e is adjacent to the hard mask member 1025e and is further adjacent to the hard mask member 1025f; a hard mask member 1020f is adjacent to the hard mask member 1025f and is further adjacent to the hard mask member 1025g; a hard mask member 1020g is adjacent to the hard mask member 1025g and is further adjacent to the hard mask member 1025h; and a hard mask member 1020h is adjacent to the hard mask member 1025h and is further adjacent to the hard mask member 1025i.

The solid metallized film 1000 can be treated to form a solid metallized film 1030 that defines an opening 1050, as illustrated in FIG. 10B. Treating the solid metallized film 1000 can include depositing a HM layer on an upper surface of the ES layer 1028, and subjecting the HM layer to a wet etch process or a dry etch process to form or otherwise transfer a defined feature onto the HM layer. To that end, in accordance with aspects described herein, a PR mask layer (not depicted) can be deposited on an upper surface of the HM layer, and patterned to define an opening that permits etching the HM layer, resulting in the treated HM layer 1040. The treated HM layer 1040 can expose a portion of the upper surface of the ES layer 1028 and can be utilized to remove a portion of the ES layer 1028, yielding a treated ES layer 1035. The treated HM layer 1040 and the ES layer 1035 can collectively define at least a portion of the opening 1050.

In addition, in one aspect, prior to the formation of the opening 1050, an exposed portion of the upper surface of the HM member 1025f can be treated to remove the HM member 1025f. Treating the HM member 1025 can include subjecting the metal interconnect 910f to a wet etch process or a dry etch process, forming another portion of the opening 950. Thus, without intending to be limited by design considerations, in one aspect, the HM member 1025 can increase etching selectivity with respect to the removal of a portion of the ES layer 1028, which increased selectivity also can result in increased controllability of the process for removing an amount of metal from the solid metallized film 1000.

The solid metallized film 1030 can be treated to fill at least a portion of the opening 1050 in accordance with aspects described herein to yield the solid metallized film 1060 illustrated in FIG. 10C. More specifically, the treatment can include deposition of a dielectric material, which is utilized to form a dielectric member 1070. The treatment also can include deposition of an ES layer 1080. As disclosed herein, the formation of the ES layer 1080 can permit further processing of the solid metallized film 1060 according to a defined POR associated with an intended or otherwise desired chipset having integrated circuitry.

Figure 11A:
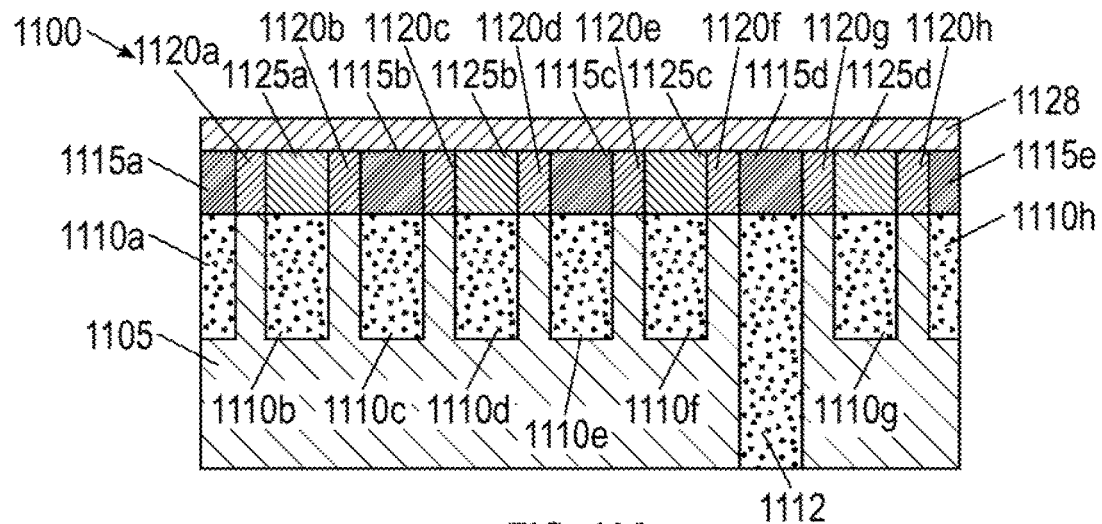
FIGS. 11A-11C illustrate schematic cross-sectional views representative of stages of an example process for selectively removing a float interconnect in accordance with one or more embodiments of the disclosure. Specifically.
Figure 11B:
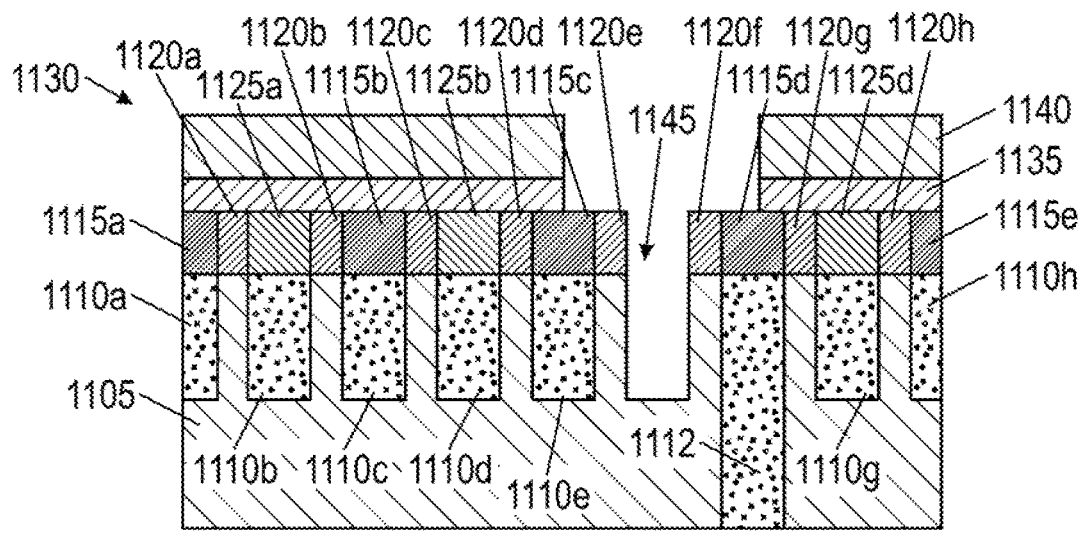
Figure 11C:
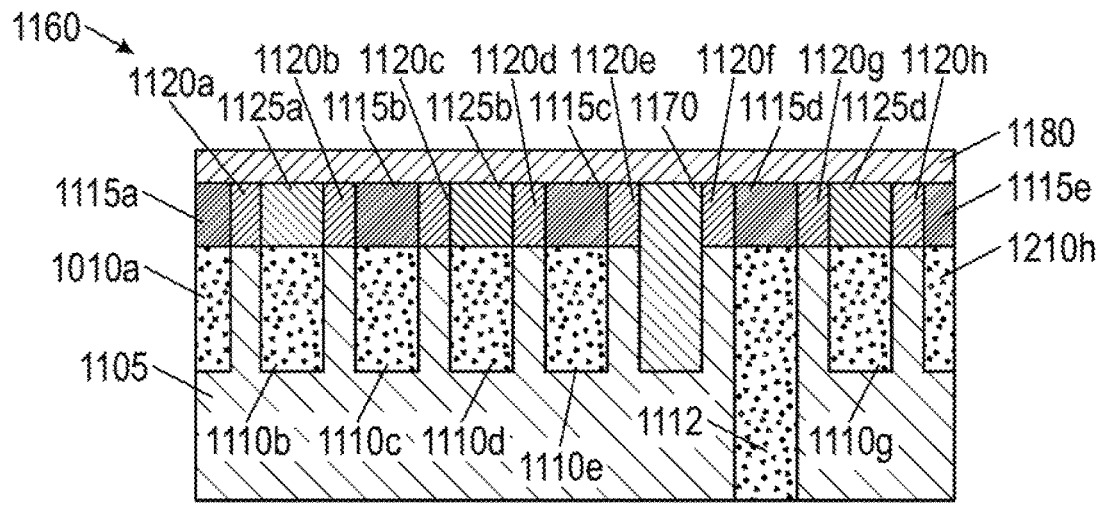

FIGS. 11A-11C illustrate schematic cross-sectional views representative of stages of an example process for selectively removing a float interconnect in accordance with one or more embodiments of the disclosure. Specifically, FIG. 11A illustrates a schematic cross-sectional view of a solid metallized film 1100 having three-color patterning including a first type of hard mask members, a second type of hard mask members, and a third type of hard mask members in accordance with one or more embodiments of the disclosure. The solid metallized film 1100 can constitute a semiconductor die that is being formed according to a defined POR. As illustrated, the solid metallized film 1100 includes a dielectric structure 1105 that can embody or can constitute an ILD structure or an IMD structure. The solid metallized film 1100 also can have multiple conductive interconnects, including a metal interconnect 1010a, a metal interconnect 1010b, a metal interconnect 1010c, a metal interconnect 1010d, a metal interconnect 1010e, a metal interconnect 1010f, a metal interconnect 1010g, and a metal interconnect 1010h. The multiple interconnects also can include a metal interconnect 1112 that can be, for example, a power interconnect included in a PDN, where the power interconnect can embody or can constitute, in some embodiments, a via configured at a high voltage. As illustrated, the first type of hard mask members can respectively cap (or otherwise cover) a subset of the metal interconnects of the multiple conductive interconnects. Specifically, the hard mask member 1115a caps the metal interconnect 1110a; a hard mask member 1115b caps the metal interconnect 1110c; a hard mask member 1115c caps the metal interconnect 1110e; a hard mask member 1115d caps the metal interconnect 1112; and a hard mask member 1115e caps the metal interconnect 1110h. In addition, the second type of hard mask members can respectively cap (or otherwise cover) a second subset of the metal interconnects of the multiple conductive interconnects. Specifically, a hard mask member 1125a caps the metal interconnect 1110b; a hard mask member 1125b caps the metal interconnect 1110d; a hard mask member 1125c caps the metal interconnect 1110f; and a hard mask member 1125d caps the metal interconnect 1110h.

Further, the third type of hard mask members is intercalated with the first type and second type of hard mask members. Specifically, a hard mask member 1120a is adjacent to the hard mask member 1115a and is further adjacent to the hard mask member 1125a; a hard mask member 1120b is adjacent to the hard mask member 1125a and is further adjacent to the hard mask member 1115b; a hard mask member 1120c is adjacent to the hard mask member 1115b and is further adjacent to the hard mask member 1125b; a hard mask member 1120d is adjacent to the hard mask member 1125b and is further adjacent to the hard mask member 1115c; a hard mask member 1120e is adjacent to the hard mask member 1115c and is further adjacent to the hard mask member 1125c; a hard mask member 1120f is adjacent to the hard mask member 1125c and is further adjacent to the hard mask member 1115d; a hard mask member 1120g is adjacent to the hard mask member 1115d and is further adjacent to the hard mask member 1125d; and a hard mask member 1120h is adjacent to the hard mask member 1125d and is further adjacent to the hard mask member 1115e.

The solid metallized film 1100 also can include an etch stop layer 1128 or another type of barrier layer that can prevent or otherwise mitigate migration of metal ions from the metal interconnects 1110a-1110h and the metal interconnect 1112 to another layer of dielectric material that may be formed on the upper surface of the solid metallized film 700.

In one aspect, the solid metallized film 1100 can be treated in order to remove a particular metal interconnect. The type of metal interconnect that can be removed can be determined by the particular type of the hard mask member type that is formed monolithically on top of the particular metal interconnect. For example, in connection with the metal interconnect 1110f, the solid metallized film 1100 can be treated to selectively remove first the hard mask member 1125c. FIG. 11B illustrates a schematic cross-sectional view of a solid metallized film 1130 that defines an opening 1145 after the removal of metal in accordance with one or more embodiments of the disclosure. Treating the solid metallized film 1100 can include depositing a HM layer on an upper surface of the ES layer 1128, and subjecting the HM layer to a wet etch process or a dry etch process to form or otherwise transfer a defined feature onto the HM layer. To that end, in accordance with aspects described herein, a PR mask layer (not depicted) can be deposited on an upper surface of the HM layer, and patterned to define an opening that permits etching the HM layer, resulting in the treated HM layer 1140. The treated HM layer 1140 can expose a portion of the upper surface of the ES layer 1128 and can be utilized to remove a portion of the ES layer 1128, yielding a treated ES layer 1135. The treated HM layer 1140 and the ES layer 1135 can collectively define at least a portion of the opening 1145.

In addition, in one aspect, prior to the formation of the opening 1145, an exposed portion of the upper surface of the HM member 1125c can be treated to remove the HM member 1125c. Treating the HM member 1125c can include subjecting the HM member 1125c to a wet etch process or a dry etch process, forming another portion of the opening 1145. Thus, without intending to be limited by design considerations, in one aspect, the HM member 1125c can increase etching selectivity with respect to the removal of a portion of the ES layer 1128, which increased selectivity also can result in increased controllability of the process for removing an amount of metal from the solid metallized film 1100.

The solid metallized film 1130 can be treated to fill at least a portion of the opening 1145 in accordance with aspects described herein to yield the solid metallized film 1160 illustrated in FIG. 11C. More specifically, the treatment can include deposition of a dielectric material, which is utilized to form a dielectric member 1170. The treatment also can include deposition of an ES layer 1180. As disclosed herein, the formation of the ES layer 1180 can permit further processing of the solid metallized film 1060 according to the defined POR associated with an intended or otherwise desired chipset having integrated circuitry.

Figure 12A:
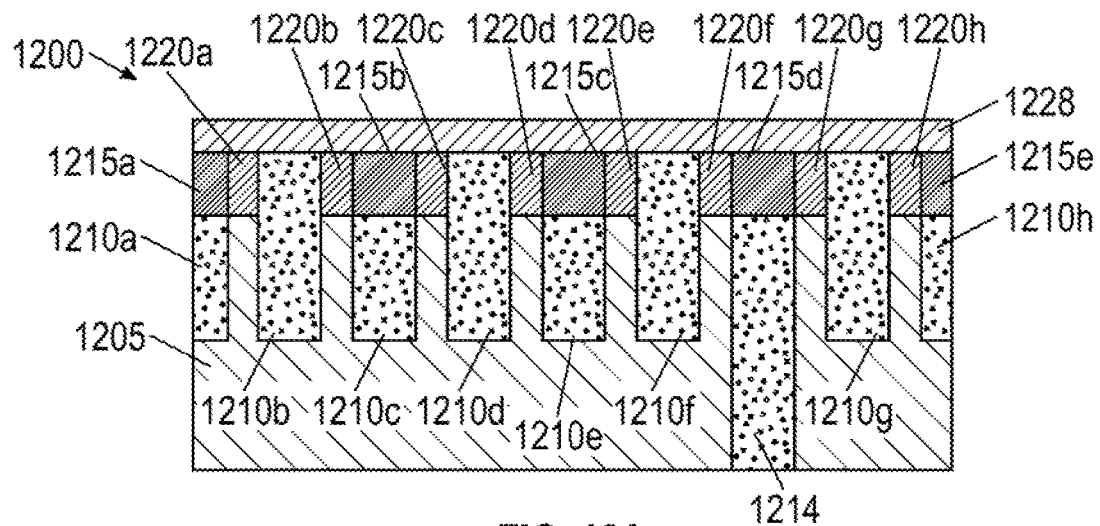
FIGS. 12A-12C illustrate schematic cross-sectional views representative of stages of an example process for selectively removing a float interconnect in accordance with one or more embodiments of the disclosure. Specifically.
Figure 12B:
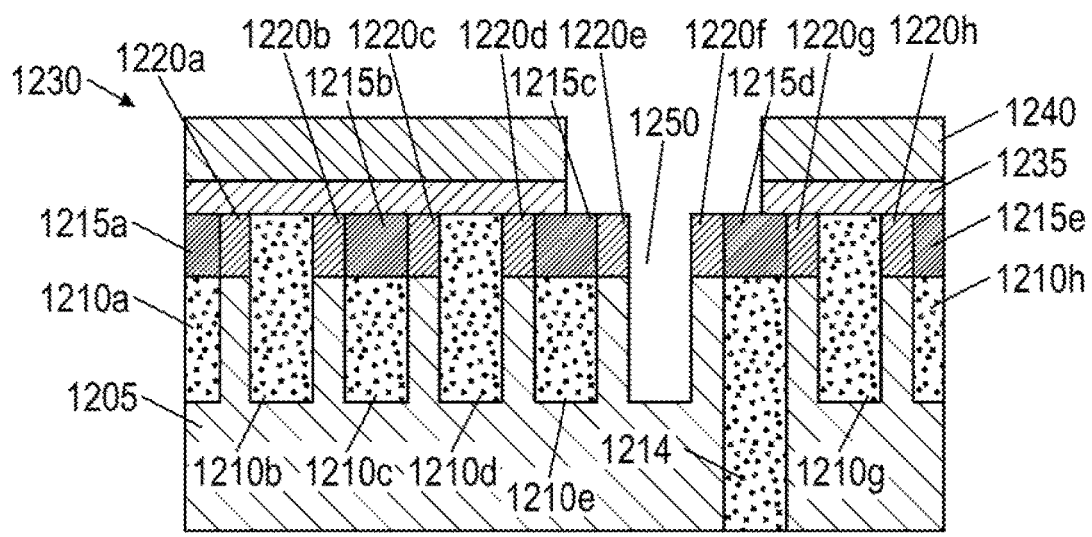
Figure 12C:
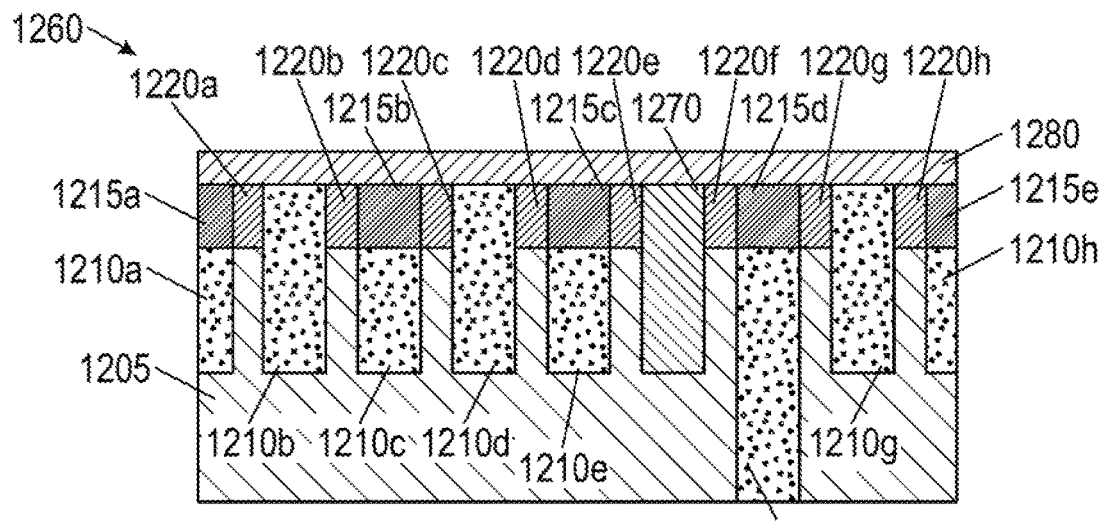

The processing flexibility afforded by multicolor patterning also can include the configurable nature of the spatial arrangement of different types of hard mask members. As an illustration, FIGS. 12A-12C present schematic cross-sectional views representative of stages of an example process for selectively removing a float interconnect in accordance with one or more embodiments of the disclosure. Specifically, FIG. 12A illustrates a schematic cross-sectional view of a solid metallized film 1200 having two-color patterning including a first type of hard mask members and a second type of hard mask members in accordance with one or more embodiments of the disclosure. The solid metallized film 1200 includes a dielectric structure 1205 having embedded therein multiple conductive interconnects, including a metal interconnect 1210*a*, a metal interconnect 1210*b*, a metal interconnect 1210*c*, a metal interconnect 1210*d*, a metal interconnect 1210*e*, a metal interconnect 1210*f*, a metal interconnect 1210*g*, and a metal interconnect 1010*h*. As in other embodiments, the conductive interconnects also can include a power interconnect 1215 which can embody or can constitute, in some embodiments, a via configured at a high voltage. The via can be configured for inclusion in a PDN. In some aspects, the power interconnect 1214 can include or can form, for example, an interlayer interconnect that can be configured at high voltage or another defined voltage in the PDN. In addition, the solid metallized film 1200 also includes an ES layer 1228 or another type of barrier layer that can prevent or otherwise mitigate migration of metal ions from one or more of the metal interconnects 1210*a*-1210*h* and the metal interconnect 1214 to another layer of dielectric material that may be formed on the upper surface of the solid metallized film 1200.

As illustrated in FIG. 12A, a first type of hard mask members can cap (or otherwise cover) a subset of the metal interconnects of the multiple conductive interconnects. Specifically, a hard mask member 1215*a* caps the metal interconnect 1210*a*; a hard mask member 1215*b* caps the metal interconnect 1210*c*; a hard mask member 1215*c* caps the metal interconnect 1210*e*; a hard mask member 1215*d* caps the metal interconnect 1210*d*; and a hard mask member 1215*e* caps the metal interconnect 1210*h*. In addition, the solid metallized film 1200 can include a second type of hard mask members, each of which members abutting a hard member of the first type and further abutting a metal interconnect of the multiple conductive interconnects. Specifically, a hard mask member 1220*a* is adjacent to the hard mask member 1215*a* and is further adjacent to the metal interconnect 1210*b*; a hard mask member 1220*b* is adjacent to the metal interconnect 1210*b* and is further adjacent to the hard mask member 1215*b*; a hard mask member 1220*c* is adjacent to the hard mask member 1215*b* and is further adjacent to the metal interconnect 1210*d*; a hard mask member 1220*d* is adjacent to the metal interconnect 1210*d* and is further adjacent to the hard mask member 1215*c*; a hard mask member 1220*e* is adjacent to the hard mask member 1215*c* and is further adjacent to the metal interconnect 1210*f*; a hard mask member 1220*f* is adjacent to the metal interconnect 1210*f* and is further adjacent to the hard mask member 1215*d*; a hard mask member 1220*g* is adjacent to the hard mask member 1215*d* and is further adjacent to the metal interconnect 1210*h*; and a hard mask member 1220*h* is adjacent to the metal interconnect 1210*g* and is further adjacent to the hard mask member 1215*e*.

The solid metallized film 1200 can be treated to form a solid metallized film 1230 that defines an opening 1250, as illustrated in FIG. 12B. Treating the solid metallized film 1200 can include depositing a HM layer on an upper surface of the ES layer 1228, and subjecting the HM layer to a wet etch process or a dry etch process to form or otherwise transfer a defined feature onto the HM layer. To that end, in accordance with aspects described herein, a PR mask layer (not depicted) can be deposited on an upper surface of the HM layer, and patterned to define an opening that permits etching the HM layer, resulting in the treated HM layer 1240. The treated HM layer 1240 can expose a portion of the upper surface of the ES layer 1228 and can be utilized to remove a portion of the ES layer 1228, yielding a treated ES layer 1235. The treated HM layer 1240 and the ES layer 1235 can collectively define at least a portion of the opening 1250.

In addition, in one aspect, prior to the formation of the opening 1250, an exposed portion of the upper surface of the metal interconnect 1210*f* can be treated to remove the metal interconnect 1210*f*. Treating the metal interconnect 1210*f* can include subjecting the metal interconnect 1210*f* to a wet etch process, forming another portion of the opening 1250. Thus, without intending to be limited by design considerations, in one aspect, the HM member 1215*c*, the HM member 1215*d*, the HM member 1220*e*, the HM member 1220*e*, and the HM member 1220*f* can increase process tolerance to the removal of an amount of metal in the solid metallized film 1200 by permitting or otherwise facilitating the utilization of a large cross-section, in the x-y plane, opening 1250. Utilization of a large cross-section opening can simplify the patterning and registration of the PR mask layer that permits transferring the feature to the ES layer 1228.

The solid metallized film 1230 can be treated to fill at least a portion of the opening 1250 in accordance with aspects described herein to yield the solid metallized film 1260 illustrated in FIG. 12C. More specifically, the treatment can include deposition of a dielectric material, which is utilized to form a dielectric member 1270. The treatment also can include deposition of an ES layer 1280. As disclosed herein, the formation of the ES layer 1280 can permit further processing of the solid metallized film 1260 according to the defined POR utilized to form the precursor solid metallized film 1200.

Figure 13A:
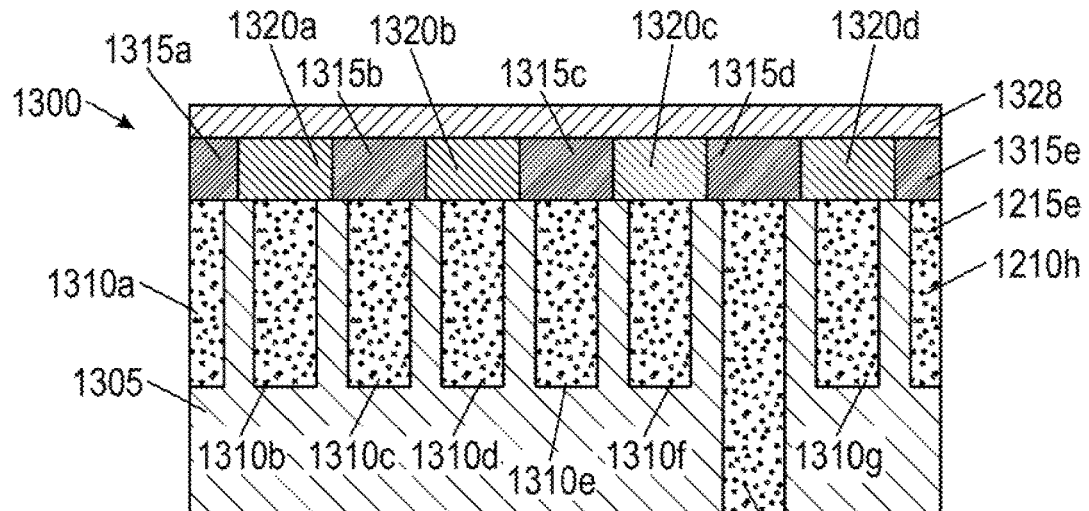
FIGS. 13A-13C illustrate schematic cross-sectional views representative of stages of an example process for selectively removing a float interconnect in accordance with one or more embodiments of the disclosure. Specifically.
Figure 13B:
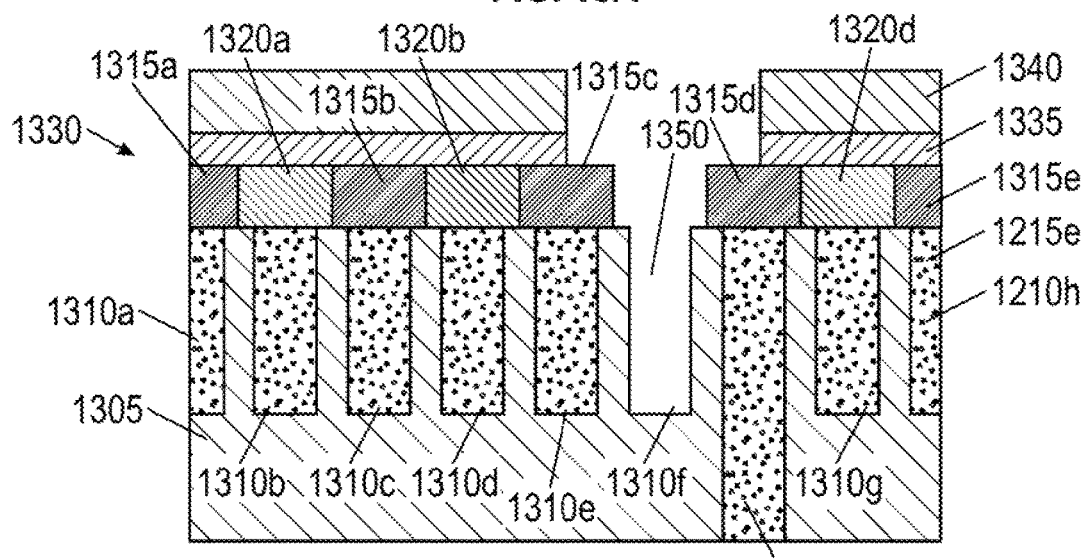
Figure 13C:
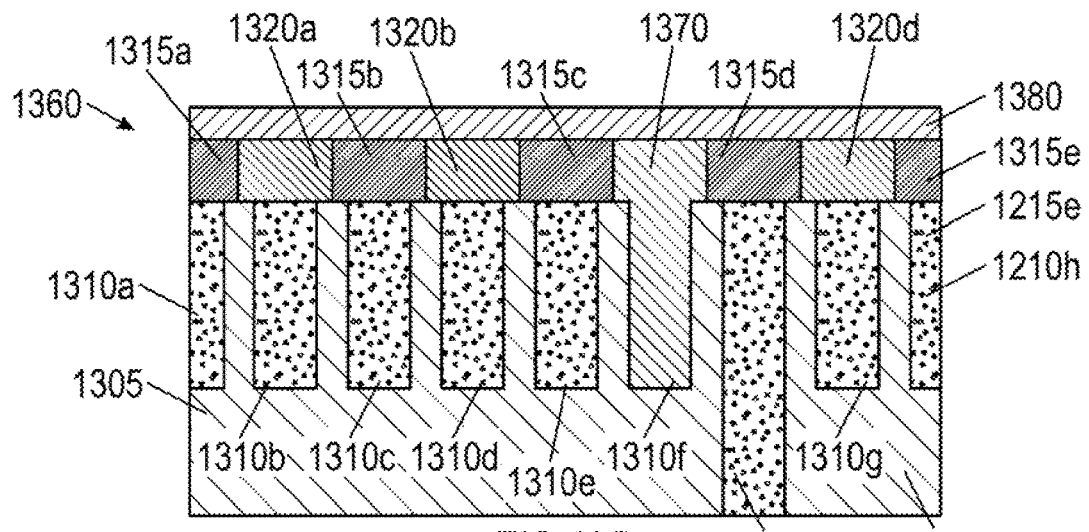

FIGS. 13A-13C illustrate schematic cross-sectional views representative of stages of an example process for selectively removing a float interconnect in accordance with one or more embodiments of the disclosure. Specifically, FIG. 13A illustrates a schematic cross-sectional view of solid metallized film 1300 having two-color patterning including a first type of hard mask members and a second type of hard mask members in accordance with one or more embodiments of the disclosure. The solid metallized film 1300 includes a dielectric structure 1305 having embedded therein multiple conductive interconnects, including a metal interconnect 1310*a*, a metal interconnect 1310*b*, a metal interconnect 1310*c*, a metal interconnect 1310*d*, a metal interconnect 1310*e*, a metal interconnect 1310*f*, a metal interconnect 1310*g*, and a metal interconnect 1310*h*. The conductive interconnects also can include a power interconnect 1314 which can embody or can constitute, in some embodiments, a via configured at a high voltage. Such a via can be configured for inclusion in a PDN. In some aspects, the power interconnect 1214 can include or can form, for example, an interlayer interconnect that can be configured at high voltage or another defined voltage in the PDN. In addition, the solid metallized film 1300 also includes an ES layer 1328 or another type of barrier layer that can prevent or otherwise mitigate migration of metal ions from one or more of the metal interconnects 1310*a*-1310*h* and the metal interconnect 1314 to another layer of dielectric material that may be formed on the upper surface of the solid metallized film 1300.

As illustrated in FIG. 13A, a first type of hard mask members can respectively cap (or otherwise cover) a subset of the metal interconnects of the multiple conductive interconnects. Specifically, a hard mask member 1315a caps the metal interconnect 1310a; a hard mask member 1315b caps the metal interconnect 1310c; a hard mask member 1315c caps the metal interconnect 1310e; a hard mask member 1315d caps the metal interconnect 1314; and a hard mask member 1315e caps the metal interconnect 1210h. In addition, a second type of hard mask members can respectively cap another subset of the metal interconnects of multiple conductive interconnects. Specifically, a hard mask member 1320a caps the metal interconnect 1310b; a hard mask member 1320b caps the metal interconnect 1310d; a hard mask member 1320c caps the metal interconnect 1310f; and a hard mask member 1320d caps the metal interconnect 1310g.

The solid metallized film 1300 can be treated to form a solid metallized film 1330 that defines an opening 1350, as illustrated in FIG. 13B. Treating the solid metallized film 1300 can include depositing a HM layer on an upper surface of the ES layer 1328, and subjecting the HM layer to a wet etch process or a dry etch process to form or otherwise transfer a defined feature onto the HM layer. To that end, in accordance with aspects described herein, a PR mask layer (not depicted) can be deposited on an upper surface of the HM layer, and patterned to define an opening that permits etching the HM layer, resulting in the treated HM layer 1340. The treated HM layer 1340 can expose a portion of the upper surface of the ES layer 1328 and can be utilized to remove a portion of the ES layer 1328, yielding a treated ES layer 1335. The treated HM layer 1340 and the treated ES layer 1335 can collectively define at least a portion of the opening 1350.

In addition, in one aspect, prior to the formation of the opening 1350, an exposed portion of the upper surface of the HM member 1320c can be treated to remove the HM member 1320c. Treating the HM member 1320c can include subjecting the HM member 1320c to a wet etch process or a dry etch process, forming another portion of the opening 1350. Thus, without intending to be limited by design considerations, in one aspect, the HM member 1320c can increase etching selectivity with respect to the removal of a portion of the ES layer 1328, which increased selectivity also can result in increased controllability of the process for removing an amount of metal from the solid metallized film 1300. Further, removal of the HM member 1320c can expose an upper surface of the metal interconnect 1310f, which can be removed by subjecting the metal interconnect 1310f to a wet etch process, yielding another portion of the opening 1350.

The solid metallized film 1350 can be treated to fill at least a portion of the opening 1350 in accordance with aspects described herein to yield the solid metallized film 1360 illustrated in FIG. 13C. More specifically, the treatment can include deposition of a dielectric material, which is utilized to form a dielectric member 1370. The treatment also can include deposition of an ES layer 1380. As disclosed herein, the formation of the ES layer 1380 can permit further processing of the solid metallized film 1360 according to the defined POR utilized to form the precursor solid metallized film 1300.

Figure 14:
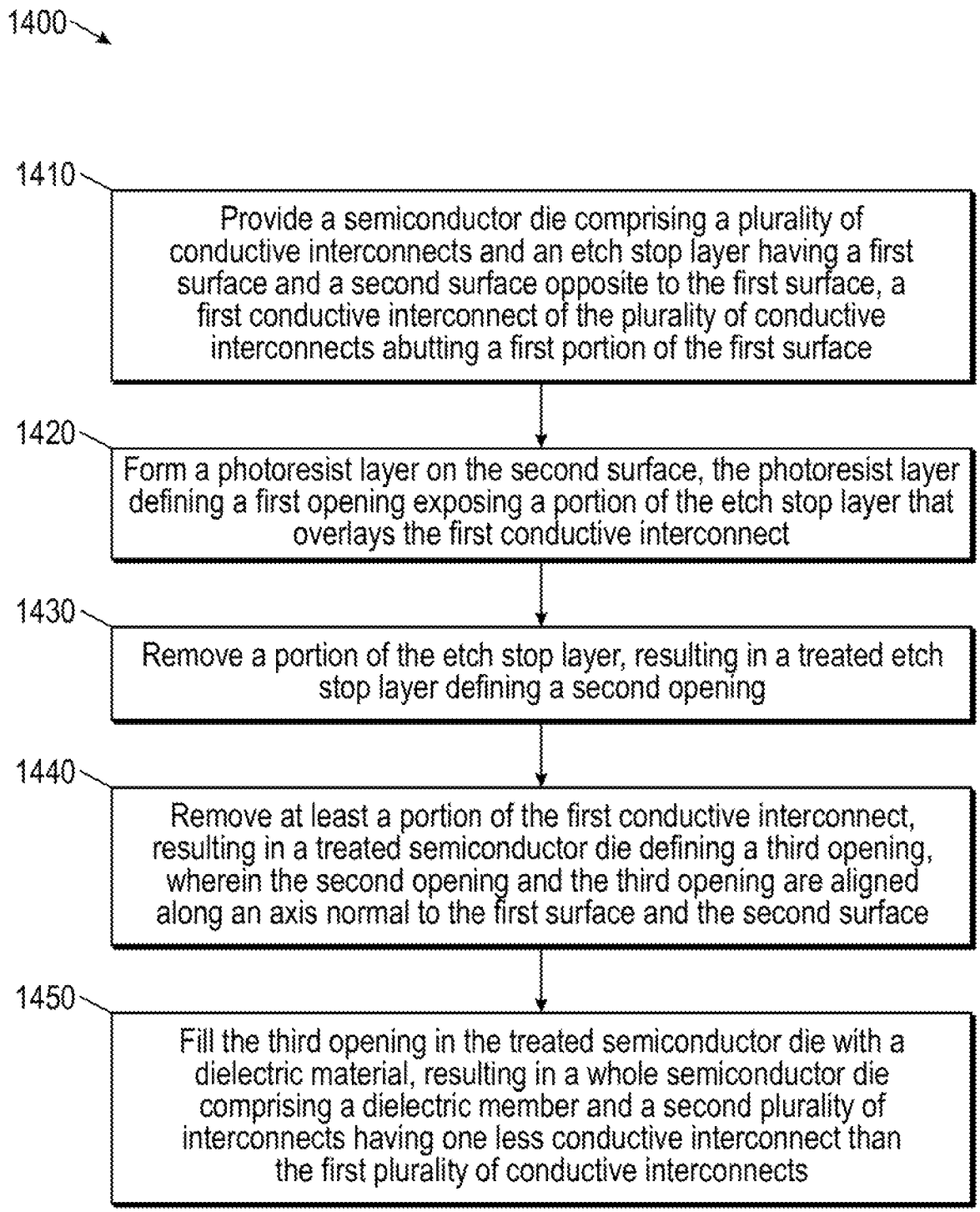
FIGS. 14-15 illustrate examples of methods for selective removal of a conductive material from a semiconductor die according to one or more embodiments of the disclosure.

FIG. 14 illustrates an example of a method 1400 for selective removal of a conductive material from a semiconductor die according to one or more embodiments of the disclosure. At block 1410, a semiconductor die can be provided, where the semiconductor die can include a plurality of conductive interconnects and an etch stop layer having a first surface and a second surface opposite to the first surface. In one aspect, a first conductive interconnect of the plurality of conductive interconnects abutting a first portion of the first surface. At block 1420, a photoresist layer can be formed on the second surface. As described herein, forming the photoresist layer can include depositing via spin coating, for example, a photoresist and subsequently applying an optical mask, such as a quartz layer, having a defined pattern of openings that permit passage of light (e.g., UV light) and irradiating the optical mask with the light in order to react certain portions of the photoresist layer. The portions can be developed or otherwise removed to form one or more openings in the photoresist layer. In some aspects, the photoresist layer can define a first opening exposing a portion of the etch stop layer that overlays the first conductive interconnect. At block 1430, a portion of the etch stop layer can be removed, resulting in a treated etch stop layer defining a second opening. As described herein, in some implementations, removing the portion of the etch stop layer can include subjecting the etch stop layer, or an exposed surface thereof, to dry etch process and/or a wet etch process. At block 1440, at least a portion of the first conductive interconnect can be removed, resulting in a treated semiconductor die defining a third opening, wherein the second opening and the third opening are aligned along an axis normal to the first surface and the second surface. As described herein, in some implementations, removing the portion of the etch stop layer can include subjecting the etch stop layer, or an exposed surface thereof, to another type of dry etch process and/or another type of wet etch process. The dry etch process and the wet etch process can selectively remove a metal or a combination of metals, for example. At block 1450, the third opening in the treated semiconductor die can be filled or otherwise covered with a dielectric material to yield a whole semiconductor die including a dielectric member and a second plurality of interconnects having one less conductive interconnect than the first plurality of conductive interconnects. As described herein, in some implementations, the filling can include depositing an amount of the dielectric material to fill at least the third opening, and in some instances, to form an overburden layer that covers the treated etch stop layer. In one aspect, the overburden layer abuts a top surface of the treated etch stop layer. In some embodiments, the example method 1400 also can include a block (not depicted) at which the overburden layer and the treated etch stop layer can be removed in order to planarize the treated semiconductor die having the third opening filled.

While not shown, in some embodiments, blocks 1420-1450 can be repeated or otherwise implemented in the semiconductor die that includes the dielectric member (as fabricated according to the example method 1400, for example) in order to selectively remove another conductive interconnect and to replace (or backfill) such a conductive interconnect with a dielectric material.

Figure 15:
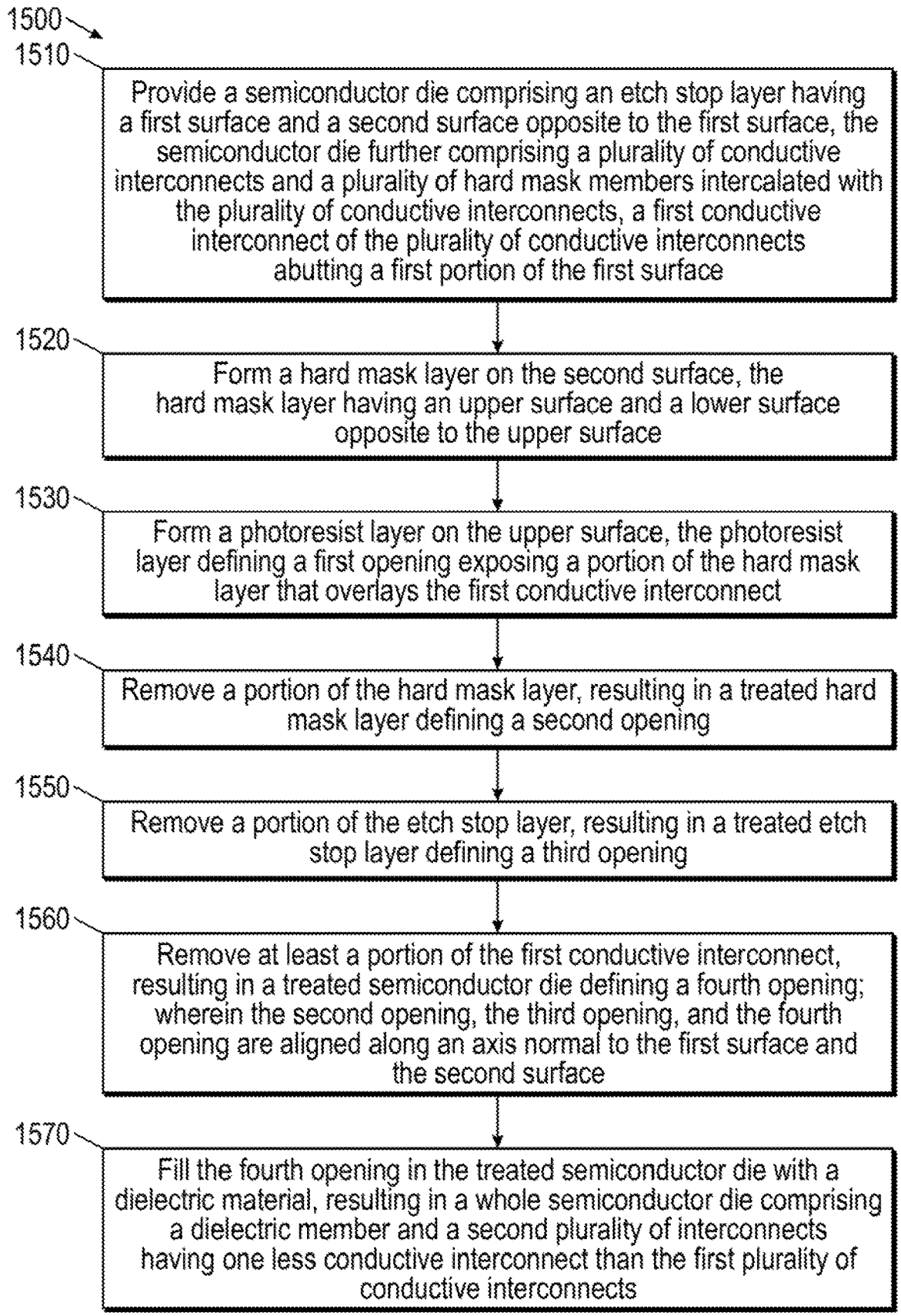

FIG. 15 illustrates an example of a method 1500 for selective removal of a conductive material from a semiconductor die according to one or more embodiments of the disclosure. At block 1510, a semiconductor die can be provided, the semiconductor die can include an etch stop layer having a first surface and a second surface opposite to the first surface, the semiconductor die further comprising a plurality of conductive interconnects and a plurality of hard mask members intercalated with the plurality of conductive interconnects, a first conductive interconnect of the plurality of conductive interconnects abutting a first portion of the first surface. At block 1520, a hard mask layer can be formed on the second surface. As described herein, the hard mask layer can be formed by one or a combination of numerous dielectric material deposition processes, including, for example, CVD; ALD; PVD; sputtering; chemical solution deposition; plating; spin coating; or the like. As mentioned, chemical vapor deposition can include, for example, MOCVD, LPCVD, or PECVD.

In some aspects, the hard mask layer can have an upper surface and a lower surface opposite to the upper surface. At block 1530, a photoresist layer can be formed on the upper surface. In some aspects, the photoresist layer can define a first opening exposing a portion of the hard mask layer that overlays the first conductive interconnect. At block 1540, a portion of the hard mask layer can be removed, resulting in a treated hard mask layer defining a second opening. As described herein, in some implementations, removing the portion of the hard mask layer can include subjecting the hard mask layer, or an exposed surface thereof, to a dry etch process and/or a wet etch process. The dry etch process and the wet etch process being selective to the material that forms the hard mask layer.

At block 1550, a portion of the etch stop layer can be removed, resulting in a treated etch stop layer defining a third opening. As described herein, in some implementations, removing the portion of the etch stop layer can include subjecting the etch stop layer, or an exposed surface thereof, to a dry etch process and/or a wet etch process. The dry etch process and the wet etch process being selective to the material that forms the etch stop layer. In some aspects, the third opening can expose a surface of the first conductive interconnect. In some embodiments, the semiconductor die provided at block 1510 also can include a hard mask member (e.g., HM member 703*c*) placed on a surface of the first conductive interconnect (e.g. metal interconnect line 701*f*), where the hard mask member covers the first conductive interconnect. Such coverage provide increased selectivity and also renders the example method 1500 more resilient to processing errors (such as misalignments) in prior blocks of the example method 1500. In an embodiment in which such a hard mask is present, abutting the surface of the first conductive interconnect (e.g., a top surface that bounds the first conductive interconnect along the stacking axis of the semiconductor), the removal of the portion of the portion of the etch stop layer can expose a portion of a surface (e.g., an upper surface along the stacking direction of the semiconductor die) of the hard mask member. Therefore, in at least such an embodiment, the example method 1500 can include an addition block (not depicted) in which the hard mask member can be removed partially or in its entirety.

At block 1560, at least a portion of the first conductive interconnect can be removed, resulting in a treated semiconductor die defining a fourth opening. In some aspects, the second opening, the third opening, and the fourth opening can be aligned along an axis normal to the first surface and the second surface. At block 1570, the fourth opening in the treated semiconductor die can be filled with a dielectric material, resulting in a whole semiconductor die comprising a dielectric member and a second plurality of interconnects having one less conductive interconnect than the first plurality of conductive interconnects.

While not shown, in some embodiments, the example method can include a block (not depicted) in which an etch stop layer can be formed on a top surface of the whole semiconductor die having the dielectric member. The that end, as described herein, the etch stop layer can be formed by one or a combination of numerous dielectric material deposition processes, including, for example, CVD; ALD; PVD; sputtering; chemical solution deposition; plating; spin coating; or the like. As mentioned, chemical vapor deposition can include, for example, MOCVD, LPCVD, or PECVD. As described herein, the etch stop layer can permit further processing, according to a POR, of the semiconductor die having the dielectric member.

In addition or in other embodiments, blocks 1520-1570 can be repeated or otherwise implemented in the semiconductor die that includes the dielectric member (as fabricated according to the example method 1500, for example) in order to selectively remove another conductive interconnect and to replace (or backfill) such a conductive interconnect with a dielectric material.

Numerous example embodiments emerge from the foregoing description and accompanying drawings. Specifically, according to example embodiments of the disclosure, there may be a method. The method may comprise: providing a semiconductor die comprising an etch stop layer having a first surface and a second surface opposite to the first surface, the semiconductor die further comprising a plurality of conductive interconnects and a plurality of hard mask members intercalated with the plurality of conductive interconnects, a first conductive interconnect of the plurality of conductive interconnects abutting a first portion of the first surface; forming a hard mask layer on the second surface, the hard mask layer having an upper surface and a lower surface opposite to the upper surface; forming a photoresist layer on the upper surface, the photoresist layer defining a first opening exposing a portion of the hard mask layer that overlays the first conductive interconnect; removing a portion of the hard mask layer, resulting in a treated hard mask layer defining a second opening; removing a portion of the etch stop layer, resulting in a treated etch stop layer defining a third opening; removing at least a portion of the first conductive interconnect, resulting in a treated semiconductor die defining a fourth opening; wherein the second opening, the third opening, and the fourth opening are aligned along an axis normal to the first surface and the second surface; and filling the fourth opening in the treated semiconductor die with a dielectric material, resulting in a whole semiconductor die comprising a dielectric member and a second plurality of interconnects having one less conductive interconnect than the first plurality of conductive interconnects.

Implementation may include one or more of the following elements. The method may comprise forming a second etch stop layer on a top surface of the whole semiconductor die. The filling may comprise depositing an amount of the dielectric material to fill the first opening and the second opening, and to form an overburden layer that covers the treated etch stop layer, the overburden layer abutting a top surface of the treated etch stop layer. The filling may further comprises removing the overburden layer and the treated etch stop layer to planarize the treated semiconductor die having the second opening filled. Removing the portion of the etch stop layer may comprise anisotropically etching the etch stop layer. Removing the at least the portion of the first conductive interconnect may comprise anisotropically etching a bulk portion of the first conductive interconnect and a liner portion of the first conductive interconnect. The anisotropically etching may comprise treating the at least the portion of the etch stop layer according to one of a wet etch process or a dry etch process.

According to example embodiments of the disclosure, there may be a method. The method may comprise: providing a semiconductor die comprising a plurality of conductive interconnects and an etch stop layer having a first surface and a second surface opposite to the first surface, a first conductive interconnect of the plurality of conductive interconnects abutting a first portion of the first surface; forming a photoresist layer on the second surface, the photoresist layer defining a first opening exposing a portion of the etch stop layer that overlays the first conductive interconnect; removing a portion of the etch stop layer, resulting in a treated etch stop layer defining a second opening; removing at least a portion of the first conductive interconnect, resulting in a treated semiconductor die defining a third opening, wherein the second opening and the third opening are aligned along an axis normal to the first surface and the second surface; and filling the third opening in the treated semiconductor die with a dielectric material, resulting in a whole semiconductor die comprising a dielectric member and a second plurality of interconnects having one less conductive interconnect than the first plurality of conductive interconnects.

Implementation may include one or more of the following elements. The method may comprise forming a second etch stop layer on a top surface of the whole semiconductor die. The filling may comprise depositing an amount of the dielectric material to fill the first opening and the second opening, and to form an overburden layer that covers the treated etch stop layer, the overburden layer abutting a surface of the treated etch stop layer. The filling may further comprise removing the overburden layer and the treated etch stop layer to planarize the treated semiconductor die having the second opening filled. Removing the portion of the etch stop layer may comprise anisotropically etching the etch stop layer. Removing the at least the portion of the first conductive interconnect may comprise anisotropically etching a bulk portion of the first conductive interconnect and a liner portion of the first conductive interconnect. The anisotropically etching may comprises treating the at least the portion of the etch stop layer according to one of a wet etch process or a dry etch process.

According to example embodiments of the disclosure, there may be a solid film. The solid film may comprise: a dielectric structure; a first conductive interconnect line embedded in the dielectric structure, the first conductive interconnect line having a first upper surface and extending along a defined direction; a second conductive interconnect line embedded in the dielectric structure, the second conductive interconnect line having a second upper surface and extending along the defined direction, wherein the second upper surface and the first upper surface are substantially coplanar; and a dielectric member adjacent to the first conductive interconnect line and further adjacent to the second conductive interconnect line, the dielectric member having a third upper surface substantially coplanar with the first upper surface and further substantially coplanar with the second upper surface.

Implementation may include one or more of the following elements. The solid film may comprise a third conductive interconnect line embedded in the dielectric structure, the third conductive interconnect line having an third upper surface and extending along the defined direction; a fourth conductive interconnect line embedded in the dielectric structure, the fourth conductive interconnect line having a fourth upper surface and extending along the defined direction, wherein the third upper surface and the fourth upper surface are substantially coplanar; and a second dielectric member adjacent to the third conductive interconnect line and further adjacent to the fourth conductive interconnect line, the second dielectric member having a fifth upper surface substantially coplanar with the third upper surface and further substantially coplanar with the fourth upper surface. The solid film may further comprise an etch stop layer abutting the dielectric member at the third upper surface, wherein the first conductive interconnect line is a first metal line, and wherein the second conductive interconnect line is a second metal line. The solid film may further comprise a first hard mask member abutting the dielectric member at a first side surface and further abutting the dielectric structure at surface substantially normal to the first side surface. The solid film may further comprise a second hard mask member abutting the dielectric member at a second side surface and further abutting the dielectric structure at a second surface substantially normal to the second side surface. The dielectric structure may comprise a first interlayer dielectric (ILD) material comprising, and wherein the dielectric member may comprise a second interlayer dielectric material. The first ILD material may comprise a first low-k material, and wherein the second ILD material may comprise a second low-k material. The first conductive interconnect line may comprise copper, aluminum, tungsten, titanium, tantalum, silver, gold, palladium, platinum, zinc, nickel, or an alloy of two or more of the foregoing metals, and wherein the second conductive interconnect line may comprise copper, aluminum, tungsten, titanium, tantalum, silver, gold, palladium, platinum, zinc, nickel, or an alloy of two or more of the foregoing metals. The first metal line may comprise a bulk region and a liner region abutting a surface of the dielectric structure, the bulk region including a first metal and the liner region including a second metal. The second metal line may comprise a bulk region and a liner region abutting a surface of the dielectric structure, the first bulk region including a first metal and the first liner region including a second metal.

According to example embodiments of the disclosure, there may be a semiconductor device. The semiconductor device may comprise a first layer having a first solid film comprising: a dielectric structure; a first conductive interconnect line embedded in the dielectric structure, the first conductive interconnect line having a first upper surface and extending along a defined direction; a second conductive interconnect line embedded in the dielectric structure, the second conductive interconnect line having a second upper surface and extending along the defined direction, wherein the second upper surface and the first upper surface are substantially coplanar; and a dielectric member adjacent to the first conductive interconnect line and further adjacent to the second conductive interconnect line, the dielectric member having a third upper surface substantially coplanar with the first upper surface and further substantially coplanar with the second upper surface; and a second layer overlaying the first layer and having a second solid film comprising a second dielectric structure; a third conductive interconnect line embedded in the second dielectric structure, the second conductive interconnect line having a third upper surface and extending along the defined direction; a fourth conductive interconnect line embedded in the second dielectric structure, the fourth conductive interconnect line having a fourth upper surface and extending along the defined direction, wherein the fourth upper surface and the first upper surface are substantially coplanar; and a second dielectric member adjacent to the third conductive interconnect line and further adjacent to the fourth conductive interconnect line, the second dielectric member having a fifth upper surface substantially coplanar with the third upper surface and further substantially coplanar with the fourth upper surface.

Implementation may include one or more of the following elements. The first dielectric structure may comprise a first interlayer dielectric film, and wherein the second dielectric structure may comprise a second dielectric film. The first conductive interconnect line may comprise a metal line having a bulk region and a liner region abutting a surface of the first dielectric structure, the bulk region including a first metal and the liner region including a second metal. The second conductive interconnect line may comprise a metal line having a bulk region and a liner region abutting a surface of the first dielectric structure, the bulk region including a first metal and the liner region including a second metal. The third conductive interconnect line may comprise a metal line having a bulk region and a liner region abutting a surface of the second dielectric structure, the bulk region including a first metal and the liner region including a second metal. The fourth conductive interconnect line may comprise a metal line having a bulk region and a liner region abutting a surface of the second dielectric structure, the bulk region including a first metal and the liner region including a second metal.

In various embodiments, the interconnects described in the disclosure can be used in connection with backend of line (BEOL) processing. BEOL can refer to a portion of IC fabrication where individual devices (transistors, capacitors, resistors, etc.) are interconnected with wiring. BEOL can include contacts, insulating layers (dielectrics), metal levels, and bonding sites for chip-to-package connections. In the BEOL part of fabrication stage contacts (pads), interconnect wires, vias and dielectric structures may be formed. For some IC processes, more than 10 metal layers can be added in the BEOL.

In various embodiments, the disclosed interconnects can be used in connection with an electronic component. The electronic components may be any suitable electronic components, including, but not limited to, integrated circuits, surface mount devices, active devices, passive devices, diodes, transistors, connectors, resistors, inductors, capacitors, microelectromechanical systems (MEMSs), combinations thereof, or the like.

In one embodiment, the interconnects may provide electrical pathways for signals between electronic components (for example, integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like.

In one embodiment, a substrate as referenced herein can refer to a solid (which is some embodiments can be planar) substance onto which a layer of another substance is applied, and to which that second substance adheres. The substrate can be a thin slab of a semiconductor material or an insulator material, such as silicon, silicon dioxide, aluminum oxide, sapphire, germanium, gallium arsenide (GaAs), an alloy of silicon and germanium, or indium phosphide (InP). These serve as the foundation upon which electronic devices such as transistors, diodes, and especially integrated circuits (ICs) are deposited.

In one embodiment, the interconnects can form a portion of a back-end interconnect, which can be part of a structure including a wafer (for example, silicon, Si), one or more transistors, and/or a backend interconnect. In one embodiment, the interconnects described herein can include multiple layers, for example, approximately 2 layers to approximately 100 layers. However, it may be appreciated that the systems and methods disclosed herein in connection with the interconnects may not be limited to any predetermined number of layers. In one embodiment, the layers of an interconnect may include metal layers, dialectic layers, interlayer dielectric layers and/or vias. In addition or in other embodiments, the plurality of lines and/or second metal layers can comprise a metallic, semi-metallic, or intermetallic material. In various embodiments, the plurality of lines and/or second metal layers can include a conductive material, such as gold, copper, silver, aluminum, zinc, tin, platinum, an alloy of two or more of the foregoing metals, and the like.

In various embodiments, the plurality of lines and/or second metal layers can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the plurality of lines and/or second metal layers can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In various embodiments, the plurality of lines and/or second metal layers may be deposited by any suitable mechanism including, but not limited to, metal foil lamination, physical vapor deposition, chemical vapor deposition, sputtering, metal paste deposition, combinations thereof, or the like.

In an embodiment, the vias may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

In some example embodiments, the hard mark layer disclosed herein may include any suitable material, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, or the like. The hard mask layer may be deposited by any suitable mechanism including plasma enhanced chemical vapor deposition (PECVD), chemical vapor deposition (CVD), spin-on processes, spray coating processes, physical vapor deposition (PVD), combinations thereof, or the like. In some example embodiments, the hard mask layer may be a silicon nitride film of a thickness in the range of about 20 nanometers to about 1 micron, such as at a thickness of 200 nm. The silicon nitride hard mask layer may be deposited by a PECVD system, such as with silane/ammonia ($SiH_4$/$NH_3$) based feed gas in a microwave plasma, such as a downstream plasma system. Alternatively, the silicon nitride hard mask layer may be formed in any suitable plasma CVD system, such as capacitively-coupled plasma, inductively-coupled plasma, high density plasma, magnetically enhanced plasma, etc. In some example embodiments, the hard mask layer may be etched using a permanganate etch solution, a phosphoric acid solution, or indeed any suitable etch for removal of the hard mask layer.

The ILD layers may be of any suitable material properties (for example, k value, leakage properties, etc.) and thicknesses. For example, relatively low-k pre-preg ILD layers may be used to allow for high-frequency, low signal degradation signaling. In some embodiments, ILD layers may include laminate ILD layers with a thickness in the range of about 25 μm to about 100 μm and metal layers in the range of about 10 μm to about 40 μm.

In some example embodiments, the spacer layers and/or the ILDs may be removed by a plasma etch process, such as a magnetically enhanced reactive ion etch (MERIE), high density plasma (HDP), or indeed any suitable plasma etch process. In some example embodiments, the spacer layers and/or the ILDs may have filler materials, resins, and/or other elements to make the spacer layers and/or the ILDs more resistant to plasma etching. Any suitable type of plasma system may be used including, but not limited to, capacitively-coupled, inductively-coupled, microwave plasma, upstream plasma, combinations thereof, or the like. Any suitable etch gases may be used, for example, fluorinated gases, such as tetrafluoromethane, hexafluoroethane, octafluoropropane, octafluorocyclobutane, herafluoro-1,3-butadiene, combinations thereof, or the like. Additionally, other gases for promoting polymerization and/or etching, as well as carrier gases may be used, such as oxygen, hydrogen, carbon dioxide, nitrogen, argon, helium, combinations thereof, or the like.

In order to fabricate the various build-up (for example, ILD), spacer, and/or metal layers described herein, various fabrication steps can be performed, including steps to deposit/laminate the layers, expose the deposited/laminated layers to radiation, develop layers, cure the layers, and pattern the layers. In one embodiment, processing the build-up (for example, ILD), spacer, and/or metal layers can further include exposing the layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including but not be limited to, approximately 436 nm, approximately 365 nm, approximately 248 nm, and approximately 193 nm. In one embodiment, there can be a one-to-one correspondence between the mask pattern and the layer pattern, for example, using one-to-one mask aligners. In other embodiments, steppers and scanners with reduction optics can be used to project and shrink the pattern by four or five times onto the surface of the layers. To achieve complete coverage, the photoimageable dielectric layer is repeatedly "stepped" from position to position under the optical column until full exposure is achieved.

In one embodiment, processing the build-up (for example, ILD), spacer, and/or metal layers can further include developing the layers using an ultraviolet light source. In one embodiment, the light types that can be used to image the layers can include, but not be limited to UV and DUV (Deep UV) with the g and I lines having wavelength of approximately 436 nm and approximately 365 nm, respectively, of a mercury-vapor lamp. In various embodiments, the development of the layers can include an exposure to the ultraviolet light source for a few seconds through the mask. The areas of the layers which are exposed stay, and the rest of the layers are developed.

In one embodiment, the developing light wavelength parameter can be related to the thickness of the layers, with thinner layers corresponding to shorter wavelengths. This can permit a reduced aspect ratio and a reduced minimum feature size.

In one embodiment, various chemicals may be used for permanently giving the build-up (for example, ILD), spacer, and/or metal layers the desired property variations. The chemicals can include but not be limited to poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the build-up (for example, ILD), spacer, and/or metal layers can further include curing the layers using a heat source. The heat source can generate heat of a predetermined temperature of approximately 120° C. to approximately 140° C. in approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

In various embodiments, the interconnects, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the interconnects, as described herein, may be used in connection with one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the interconnects can be used and/or provided may be a computing device. Such a computing device may house one or more boards on which the interconnects may be disposed. The board may include a number of components including, but not limited to, a processor and/or at least one communication chip. The processor may be physically and electrically connected to the board through, for example, electrical connections of the interconnects. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of techniques for selectively removing a metal or conductive material during processing of a semiconductor die, and semiconductor dies having neighboring metal interconnects separated by backfilled dielectric regions also are provided. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. An integrated circuit (IC) structure, comprising:
a first conductive interconnect line embedded to a depth in one or more first dielectric materials, wherein the first conductive interconnect line has a first top surface and a first bottom surface, opposite the first top surface, in direct contact with at least one of the one or more first dielectric materials;
a second conductive interconnect line substantially parallel to the first conductive interconnect line and embedded to the depth in the one or more first dielectric materials, wherein the second conductive interconnect line has a second top surface substantially coplanar with the first top surface and a second bottom surface, opposite the second top surface, in direct contact with at least one of the one or more first dielectric materials; and
a second dielectric material between, and parallel with, the first and second conductive interconnect lines, wherein the second dielectric material has a lateral width and is embedded to the depth within the one or more first dielectric materials, and wherein the second dielectric material has a third bottom surface in direct contact with at least one of the one or more first dielectric materials over an entirety of the lateral width.

2. The IC structure of claim 1, further comprising a third conductive interconnect line between, and parallel with, the first and second conductive interconnect lines, and embedded to the depth in the one or more first dielectric materials, wherein the second dielectric material has substantially the same lateral width as that of the third conductive interconnect line, wherein the third conductive interconnect line is colinear with a lateral length of the second dielectric material, orthogonal to the lateral width, and wherein a first end of the third conductive interconnect line is spaced apart from a second end of the second dielectric material with the one or more first dielectric materials between the first and second ends.

3. The IC structure of claim 2, wherein the third bottom surface is substantially coplanar with the first and second bottom surfaces.

4. The IC structure of claim 2, wherein first, second and third interconnect lines have substantially the same composition.

5. The IC structure of claim 1, wherein the first and second conductive interconnect features comprise titanium, tungsten, tantalum, aluminum, copper, ruthenium, cobalt, chromium, iron, palladium, molybdenum, manganese, vanadium, gold, silver, or niobium.

6. The IC structure of claim 1, wherein a chemical composition of the second dielectric material is different than that of at least one of the one or more first dielectric materials.

7. The IC structure of claim 1, wherein a chemical composition of the second dielectric material is the same as that of at least one of the one or more first dielectric materials.

8. The IC structure of claim 1, wherein the second dielectric material has a third top surface substantially coplanar with the first and second top surfaces.

9. The IC structure of claim 1, wherein the one or more first dielectric materials comprise:
- a bottom dielectric material in direct contact with the first and second bottom surfaces of the conductive interconnect lines; and
- a top dielectric material over the bottom dielectric material, and in direct contact with a sidewall of first and second interconnect lines.

10. The IC structure of claim 9, wherein the third bottom surface of the second dielectric material is in direct contact with the bottom dielectric material and a sidewall of the second dielectric material is in direct contact with the top dielectric material.

11. A computing device, comprising:
- a processor chip; and
- a memory chip, wherein at least one of the processor chip or memory chip comprises the IC structure of claim 1.

12. An integrated circuit (IC) structure, comprising:
- a first conductive interconnect feature embedded to a depth in a first dielectric material, wherein the first conductive interconnect feature has a first top surface and a first bottom surface, opposite the first top surface, in direct contact with the first dielectric material;
- a second conductive interconnect feature substantially parallel to the first conductive interconnect feature and embedded to the depth in the first dielectric material, wherein the second conductive interconnect feature has a second top surface substantially coplanar with the first top surface and a second bottom surface, opposite the second top surface, in direct contact with the first dielectric material;
- a second dielectric material over the first and second top surfaces of the conductive interconnect features; and
- a third dielectric material between, and parallel with, the first and second conductive interconnect features, wherein the third dielectric material has a lateral width and is embedded to the depth within the first dielectric material, and wherein the third dielectric material has a third top surface of a first lateral width that is substantially coplanar with a top surface of the second dielectric material, and wherein the third dielectric material has a third bottom surface of a second lateral width and in direct contact with the first dielectric material over an entirety of the second lateral width.

13. The IC structure of claim 12, wherein the second lateral width is smaller than the first lateral width.

14. The IC structure of claim 13, wherein the second lateral width is substantially equal to a lateral width of the first and second conductive interconnect features.

15. The IC structure of claim 12, wherein the first and second conductive interconnect features comprise titanium, tungsten, tantalum, aluminum, copper, ruthenium, cobalt, chromium, iron, palladium, molybdenum, manganese, vanadium, gold, silver, or niobium.

16. The IC structure of claim 12, wherein the first dielectric material and third dielectric material comprises silicon and oxygen.

17. The IC structure of claim 12, wherein the second dielectric material comprises silicon and nitrogen.

18. An integrated circuit (IC) structure, comprising:
- a first conductive interconnect line embedded to a depth in one or more first dielectric materials, wherein the first conductive interconnect line has a first top surface and a first bottom surface, opposite the first top surface, in direct contact with at least one of the one or more first dielectric materials;
- a second conductive interconnect line substantially parallel to the first conductive interconnect line and embedded to the depth in the one or more first dielectric materials, wherein the second conductive interconnect line has a second top surface substantially coplanar with the first top surface and a second bottom surface, opposite the second top surface, in direct contact with at least one of the one or more first dielectric materials;
- a second dielectric material between, and parallel with, the first and second conductive interconnect lines, wherein the second dielectric material is embedded to the depth within the one or more first dielectric materials, and wherein the second dielectric material has a third bottom surface in direct contact with at least one of the one or more first dielectric materials; and
- a third conductive interconnect line between, and parallel with, the first and second conductive interconnect lines and embedded to the depth in the one or more first dielectric materials, wherein:
  - the third conductive interconnect line has substantially the same lateral width as that of the second dielectric material;
  - the third conductive interconnect line is colinear with a lateral length of the second dielectric material, orthogonal to the lateral width; and
  - a first end of the third conductive interconnect line is spaced apart from a second end of the second dielectric material with the one or more first dielectric materials between the first and second ends.

19. The IC structure of claim 18, wherein the third bottom surface is substantially coplanar with the first and second bottom surfaces.

20. The IC structure of claim 18, wherein first, second and third interconnect lines have substantially the same composition.

* * * * *